US006885950B2

(12) United States Patent
Mitsutake et al.

(10) Patent No.: US 6,885,950 B2
(45) Date of Patent: Apr. 26, 2005

(54) METHOD, APPARATUS, AND COMPUTER PROGRAM OF SEARCHING FOR CLUSTERING FAULTS IN SEMICONDUCTOR DEVICE MANUFACTURING

(75) Inventors: Kunihiro Mitsutake, Kanagawa-ken (JP); Yukihiro Ushiku, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 513 days.

(21) Appl. No.: 09/931,916

(22) Filed: Aug. 20, 2001

(65) Prior Publication Data

US 2002/0053065 A1 May 2, 2002

(30) Foreign Application Priority Data

Aug. 21, 2000 (JP) ..................................... P2000-249718
Mar. 8, 2001 (JP) ..................................... P2001-065338

(51) Int. Cl.[7] ............................................. G01R 31/00
(52) U.S. Cl. ........................................ 702/58; 324/520
(58) Field of Search ............................... 702/33, 35–36, 702/81–84, 58–59, 117–118, 128, 179, 183, 185; 438/16–17; 324/512, 520, 537; 700/108–110, 121

(56) References Cited

U.S. PATENT DOCUMENTS

| 5,210,041 A | * | 5/1993 | Kobayashi et al. ............. 438/7 |
| 5,240,866 A | * | 8/1993 | Friedman et al. ............. 702/35 |
| 5,286,656 A | * | 2/1994 | Keown et al. ................ 438/18 |
| 5,440,649 A | * | 8/1995 | Kiyasu et al. ............... 382/147 |
| 5,544,256 A | * | 8/1996 | Brecher et al. ............. 382/149 |
| 5,598,341 A | * | 1/1997 | Ling et al. .................. 700/110 |
| 5,665,609 A | * | 9/1997 | Mori .......................... 438/16 |
| 5,991,699 A | * | 11/1999 | Kulkarni et al. .............. 702/83 |
| 6,393,602 B1 | * | 5/2002 | Atchison et al. ............... 716/4 |

FOREIGN PATENT DOCUMENTS

CN         1207531         2/1999

OTHER PUBLICATIONS

Wan et al., "Possibilistic–diagnosis theory for fault–section estimation and state identification of unobserved protective relays using tabu–search method", Nov. 1998, IEEE Proceedings, v145 Issue 6, pp. 722–730.*

Ikota, M. et al., "Discrimination of Clustered Defects on Wafers Using Statistical Methods", Proc. 1997 Second Int. Workshop Statistical Metrology, pp. 52–55.

Ikota, M. et al., "Discrimination of Clustered Defects on Wafers Using Statistical Methods", Proc. 1997 Second Int. Workshop Statistical Metrology, pp. 52–55.

* cited by examiner

Primary Examiner—Marc S. Hoff
Assistant Examiner—Mary Catherine Baran
(74) Attorney, Agent, or Firm—Finnegan, Henderson, Farabow, Garrett & Dunner, L.L.P.

(57) ABSTRACT

A method of searching for clustering faults is employed for semiconductor device manufacturing, The method enters data on faults present in a search target, calculates a frequency distribution of the faults in unit cells divided from the search target, approximates the frequency distribution by overlaying at least two discrete distribution functions, and searches for clustering faults according to weights of the discrete distribution functions on the frequency distribution.

15 Claims, 24 Drawing Sheets

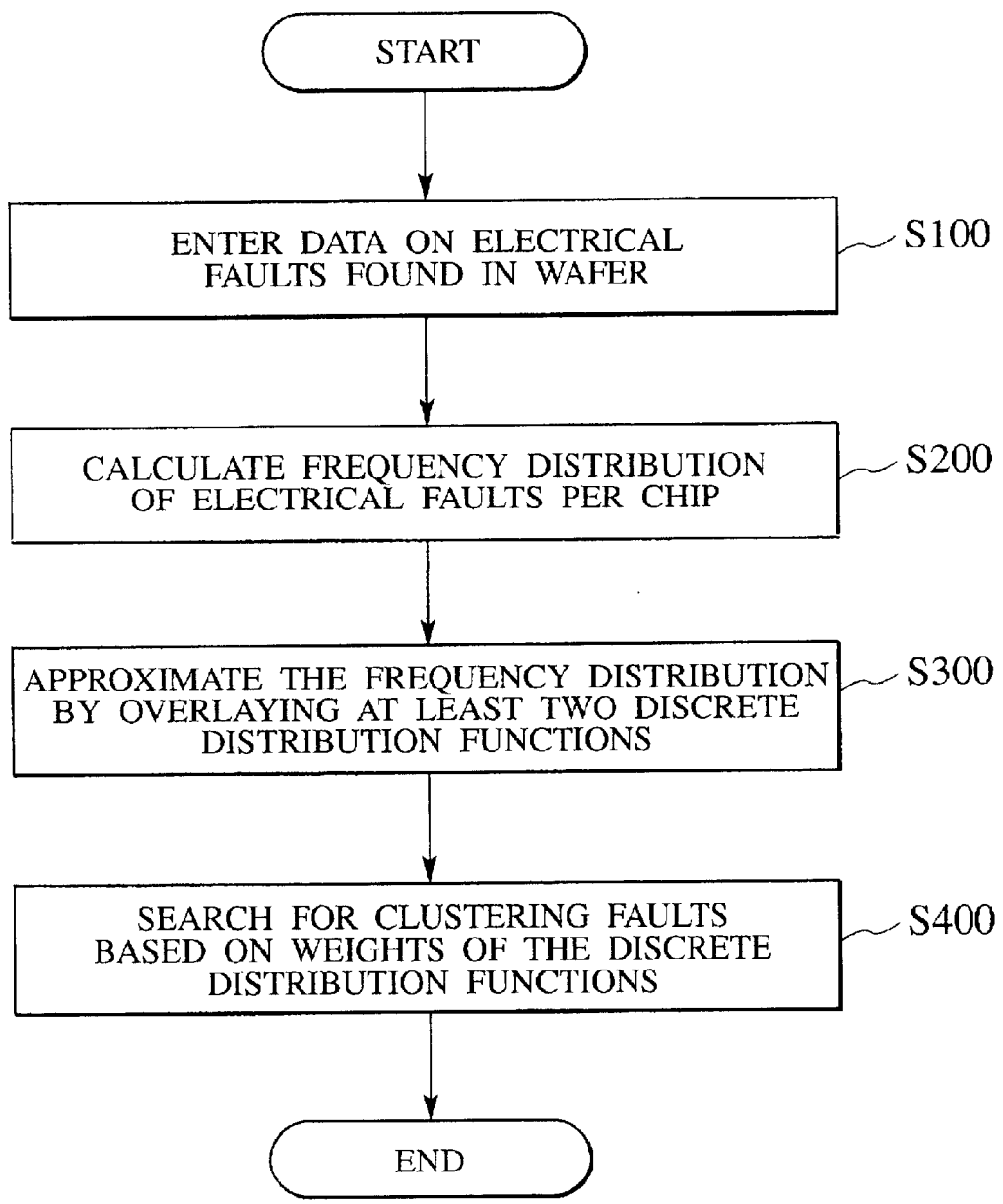

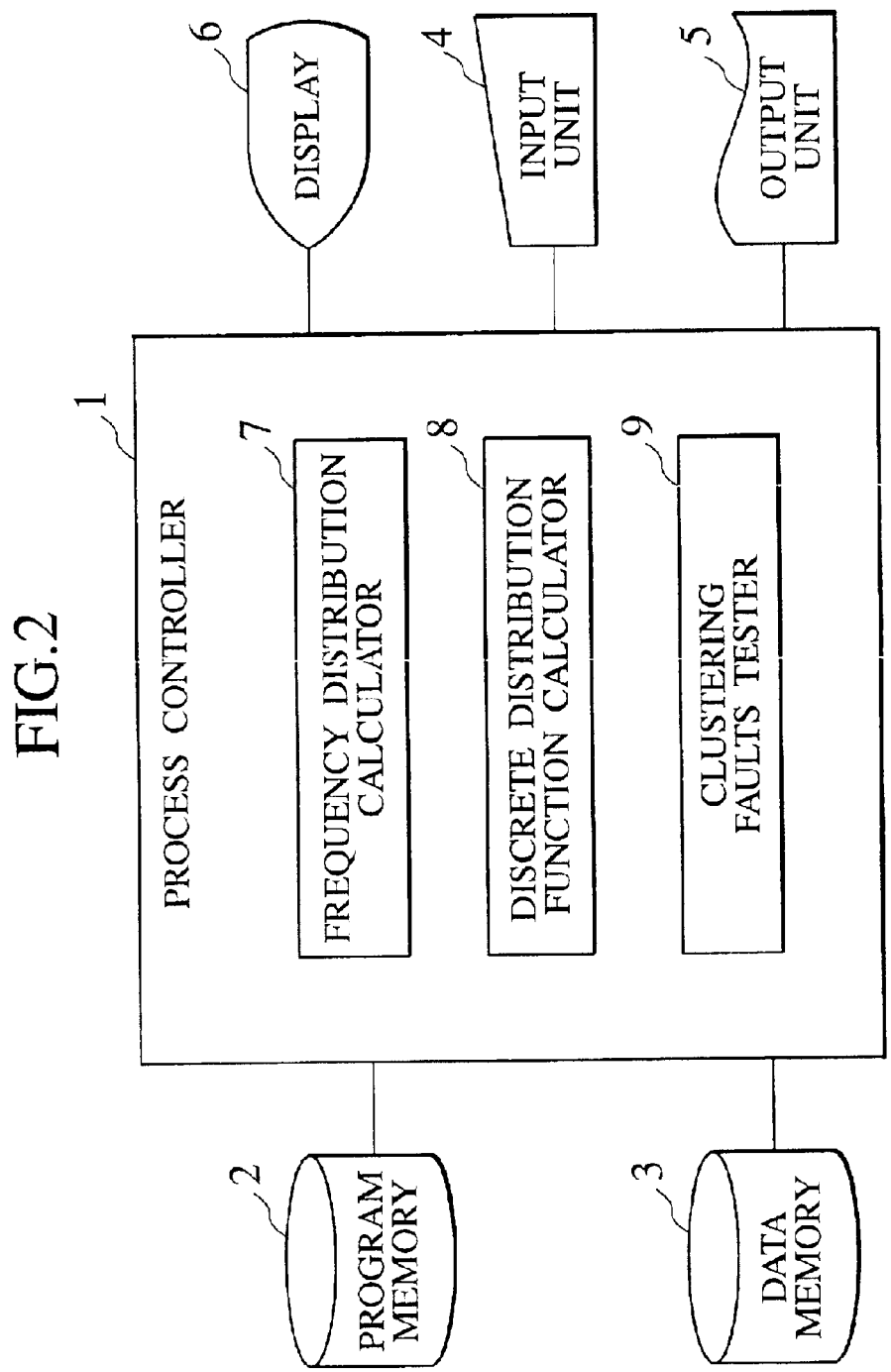

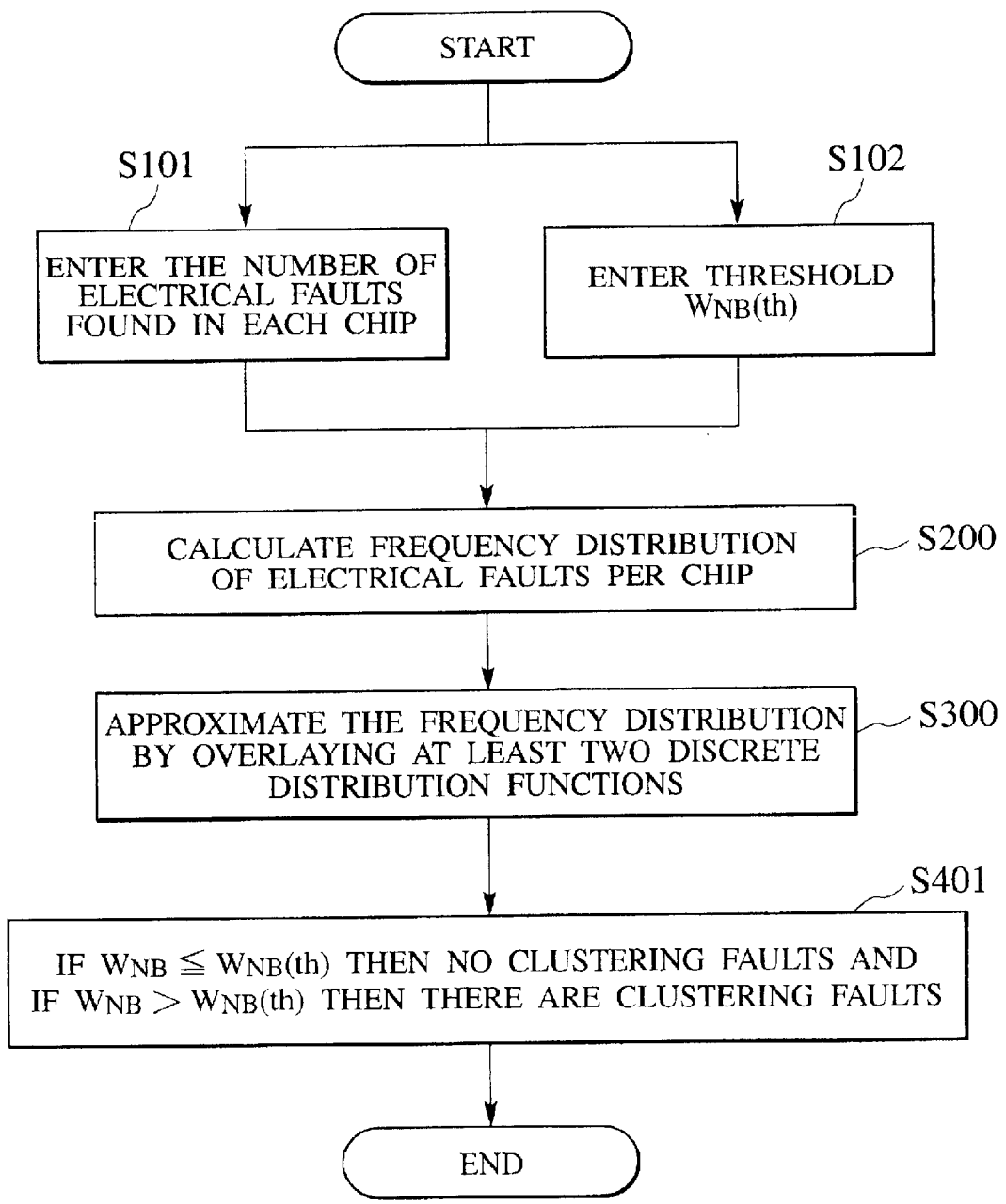

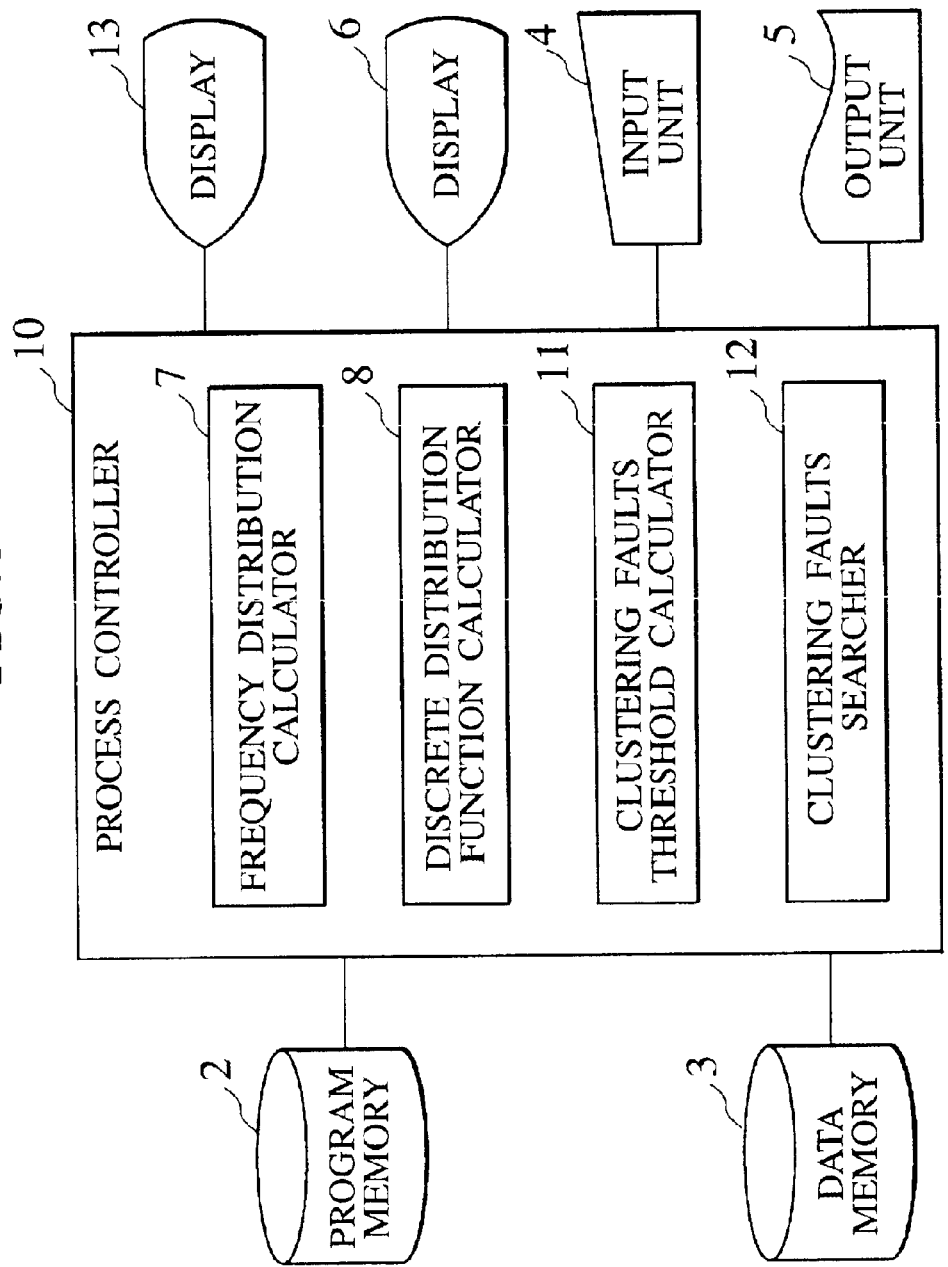

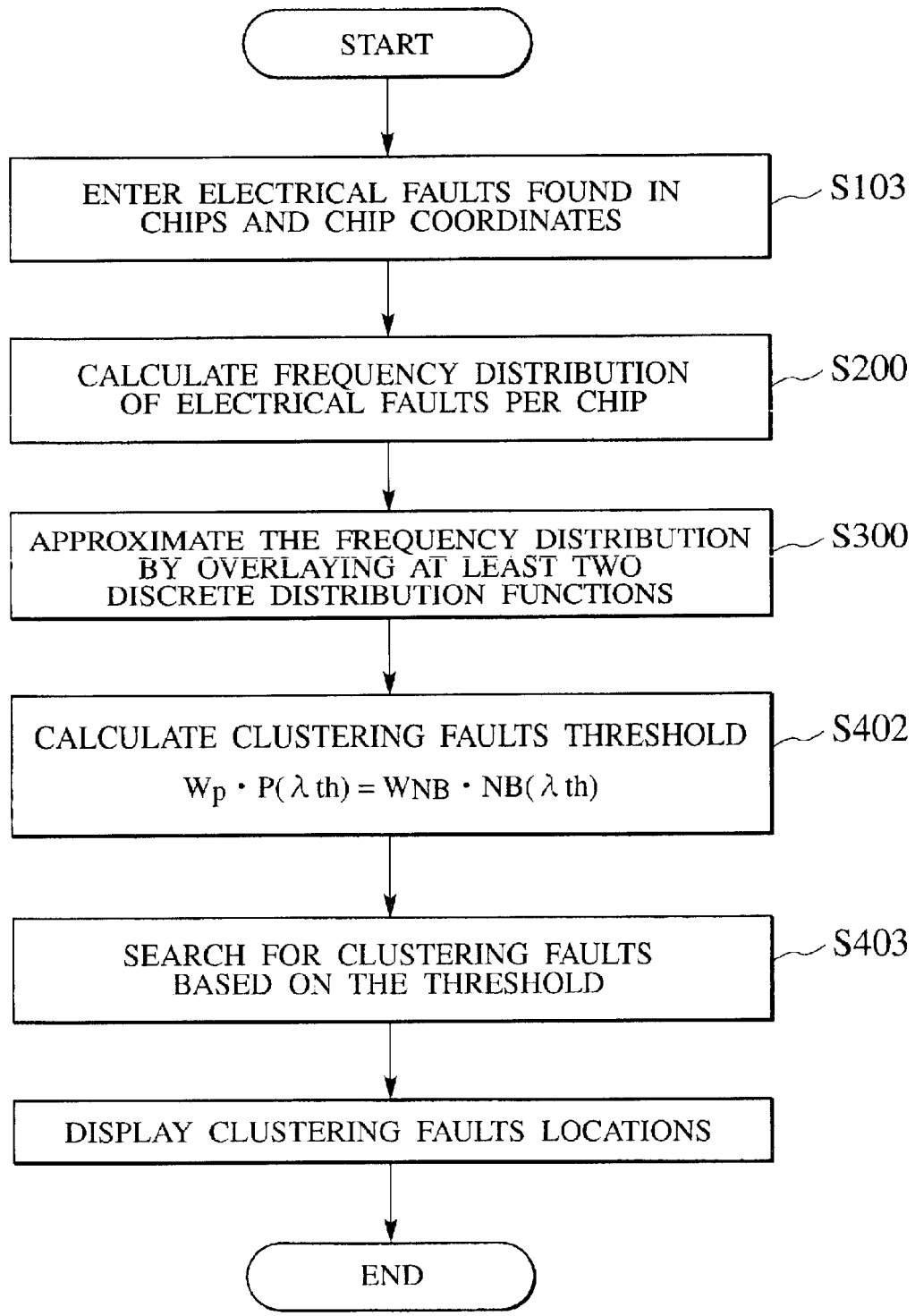

SHOT
AREA 24

CLUSTERING
FAULTS
LOCATION 25

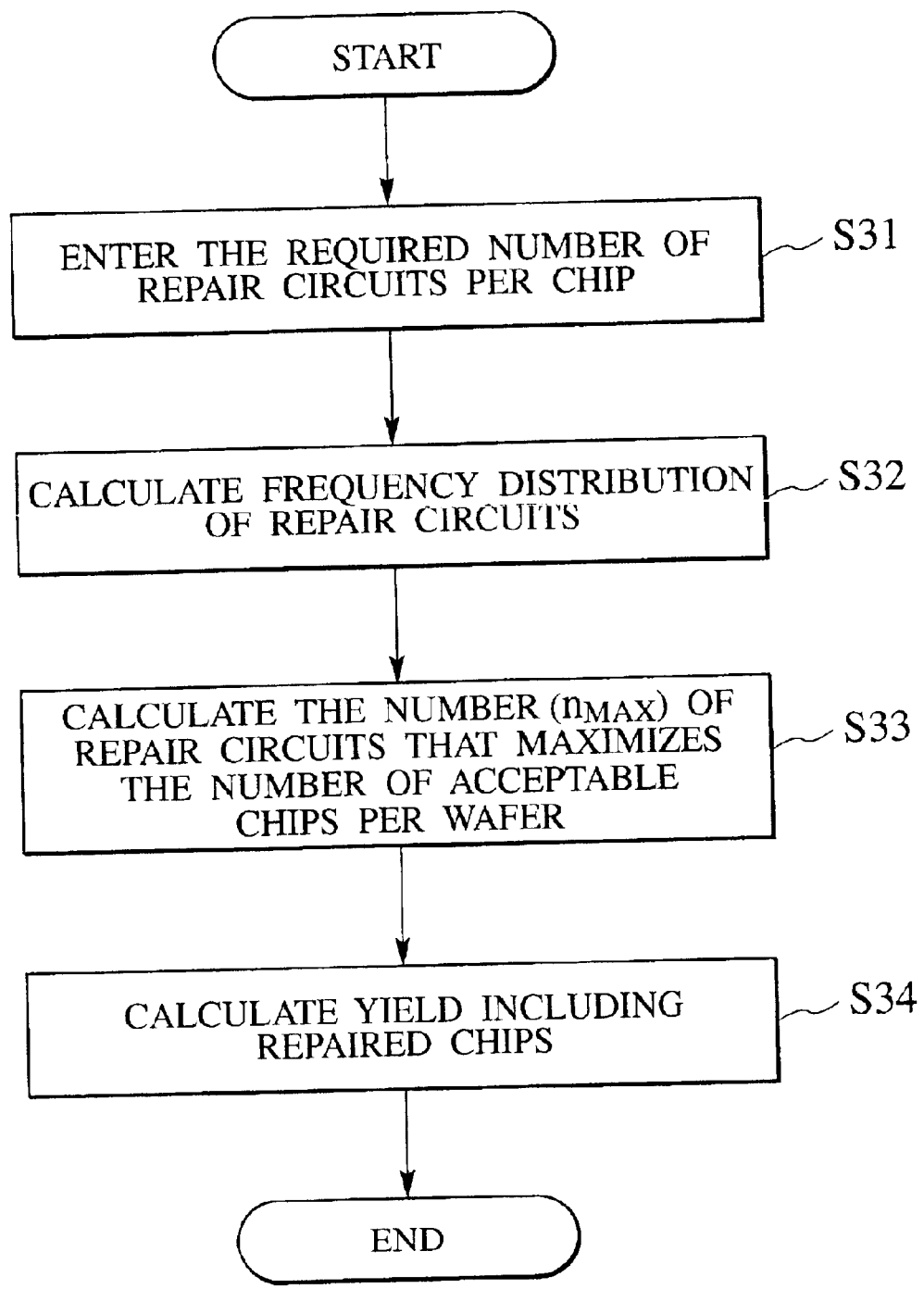

METHOD, APPARATUS, AND COMPUTER PROGRAM OF SEARCHING FOR CLUSTERING FAULTS IN SEMICONDUCTOR DEVICE MANUFACTURING

CROSS REFERENCE TO RELATED APPLICATIONS

This application claims benefit of priority under 35 USC 119 on Japanese Patent Application No. P2001-65338 filed on Mar. 8, 2001 and No. P2000-249718 filed on Aug. 21, 2000, the entire contents of which are incorporated by reference herein.

BACKGROUND OF THE INVENTION

1. Field of the Invention

The present invention relates to a technique of searching for clustering faults in semiconductor device manufacturing. In particular, the present invention relates to a method of searching for clustering faults in semiconductor device manufacturing and designing. The searched clustering faults are used to find and correct abnormalties in manufacturing processes, to improve the productivity of semiconductor devices. The present invention also relates to an apparatus to execute the method and a program to make a computer execute the method. The present invention also relates to applications of the clustering faults searching method, including a method of optimizing the number of redundant circuits in a semiconductor chip, a method of managing manufacturing processes, a method of managing a clean room, a method of manufacturing semiconductor devices, a method of finding problematic processes and equipment, and a method of determining whether or not semifinished products must be scrapped.

2. Description of the Related Art

Recent fine semiconductor devices have severe process margins to easily produce faults due to mismatched masks, uneven impurity concentrations, irregular film thicknesses, fine defects on wafers, etc. There is a need of clarifying the cause of such faults, to correct manufacturing processes accordingly and improve yield.

A process improving technique according to a prior art will be explained. This technique employs a fault map such as a fail bit map and empirically determines whether or not electrical faults found on a wafer are random or collective. The collective faults occurring at a specific location on an object are called "clustering faults." If the clustering faults are found at, for example, the periphery of a wafer, the location is investigated to estimate a cause of the faults. Misaligned masks may cause clustering electrical faults at the periphery of a wafer. Based on a result of the investigation, manufacturing equipment such as a stepper is examined to find a principal cause of the faults. Another prior art employs a fault observatory system to find faults in a wafer. If faults whose number exceeds an empirical clustering faults threshold are found at a location, the technique investigates the location for a cause.

These techniques rely on user's skill and empirical clustering faults thresholds in studying a fault map and finding clustering faults on the map, and therefore, they lack objectivity and are incapable of quantitatively determine whether or not faults in a wafer are random or clustering due to a specific cause.

Another prior art employing a statistical technique to find clustering faults is disclosed in Proc. 1997 Second Int. Workshop Statistical Metrology, pp. 52–55. This technique prepares a frequency distribution of faults in chips and approximates the frequency distribution with a Poisson distribution. A tail of the Poisson distribution corresponds to large numbers of faults and involves substantially no chips. If the tail involves any number of chips, the prior art determines that there are clustering faults. Any person skilled in the art, however, may find the presence of clustering faults on the Poisson distribution only by seeing it. This prior art provides no technique of quantitatively evaluating the tail shape of a Poisson distribution to determine the presence of clustering faults.

There is a need of providing a statistical technique of discriminating random faults from clustering faults.

BRIEF SUMMARY OF THE INVENTION

A first aspect of the present invention provides a method of searching for clustering imperfect entities, i.e., faults. The method at least includes entering data on imperfect entities present in a search target, calculating a frequency distribution of the imperfect entities in unit cells divided from the search target, approximating the frequency distribution by overlaying at least two discrete distribution functions, and searching for clustering imperfect entities according to weights of the discrete distribution functions on the frequency distribution.

The "imperfect entities" correspond to electrical faults, electrical faults in each layer, defects, defects in each layer, redundant circuits to be replaced with defective elements, etc. The imperfect entities represent electrical faults or defects not only in semiconductor chips but also in peripheral devices around semiconductor chips. The peripheral devices include resin packages, bonding wires, lead frames, etc. The electrical faults and defects include cracks, wire breaks, open faults, short circuits, etc.

The "search target" is an object on which the presence of clustering faults is tested or located. An example of the search target is a wafer, a product lot, a manufacturing line, and a manufacturing factory. The "unit cell" is one of areas divided from the search target. Imperfect entities in a search target are handled in unit cells. The number of imperfect entities in a unit cell represents the frequency of imperfect entities in the unit cell. An example of the unit cell is a "block" formed by dividing a chip into at least two blocks, a "group" formed by gathering at least two chips together, a "shot area" serving as a lithography unit, a wafer, and a product lot. A unit cell must be smaller than a search target.

The "imperfect entities" correspond to faults, and a frequency distribution of imperfect entities is a frequency distribution of random and clustering faults. The "discrete distribution functions" separately approximate the random and clustering faults contained in the frequency distribution. The discrete distribution function that approximates the random faults may be a Poisson distribution, and the discrete distribution function that approximates the clustering faults may be a negative polynomial distribution.

The "data on imperfect entries present in a search target" include the coordinates of the imperfect entities on the search target, the types (electrical faults, defects, etc.) of the imperfect entities, the number of imperfect entities in each unit cell, the coordinates of the unit cells on the search target, and a clustering faults criterion or threshold. These data pieces are used to calculate a frequency distribution of imperfect entities and determine the presence of clustering faults.

A second aspect of the present invention provides an apparatus for executing the method of the first aspect. The apparatus at least includes an input unit that enters data on imperfect entities present in a search target, a frequency distribution calculator that calculates, according to the entered data, a frequency distribution of the imperfect entities in unit cells divided from the search target, a discrete distribution function calculator that approximates the frequency distribution by overlaying at least two discrete distribution functions, and a clustering faults searcher that searches for clustering imperfect entities according to weights of the discrete distribution functions on the frequency distribution.

A third aspect of the present invention provides a program executed by a computer, to achieve the method of the first aspect. The program at least includes entering data on imperfect entities present in a search target, calculating a frequency distribution of imperfect entities in unit cells divided from the search target, approximating the frequency distribution by overlaying at least two discrete distribution functions, and searching for clustering imperfect entities according to weights of the discrete distribution functions on the frequency distribution.

A fourth aspect of the present invention provides a method of optimizing redundant circuits. The method at least includes entering the number of redundant circuits required to repair faults in chips divided from a wafer, calculating a frequency distribution of the redundant circuits on the chips, and calculating an optimum number of redundant circuits that maximizes the number of acceptable chips producible from the wafer according to a relationship between the number of redundant circuits and the number of acceptable chips producible from the wafer. As the number of redundant circuits on a chip increases, the number of acceptable chips producible from a wafer increases but the total number of chips producible from the wafer decreases.

A fifth aspect of the present invention provides a method of managing processes. The method at least includes taking one of search targets, entering data on imperfect entities present in the taken search target, calculating a frequency distribution of the imperfect entities in unit cells divided from the taken search target, approximating the frequency distribution by overlaying at least two discrete distribution functions, searching for clustering imperfect entities according to weights of the discrete distribution functions on the frequency distribution, and repeating these acts on each of the search targets.

A sixth aspect of the present invention provides a method of managing a clean room. The method is carried out in one or a plurality of imperfect-entity testing processes carried out in the clean room. The method at least includes entering data on imperfect entities present in a search target, calculating a frequency distribution of the imperfect entities in unit cells divided from the search target, approximating the frequency distribution by overlaying at least two discrete distribution functions, and searching for clustering imperfect entities according to weights of the discrete distribution functions on the frequency distribution.

A seventh aspect of the present invention provides a method of manufacturing semiconductor devices. The method is carried out in one or a plurality of imperfect-entity testing processes taking place in semiconductor device manufacturing. The method includes entering data on imperfect entities present in a search target calculating a frequency distribution of imperfect entities in unit cells divided from the search target, approximating the frequency distribution by overlaying at least two discrete distribution functions, and searching for clustering imperfect entities according to weights of the discrete distribution functions on the frequency distribution.

An eighth aspect of the present invention provides a method of identifying a problematic process and equipment. The method at least includes taking one of search targets, entering data on imperfect entities present in the taken search target, calculating a frequency distribution of the imperfect entities in unit cells divided from the search target, approximating the frequency distribution by overlaying at least two discrete distribution functions, calculating weights of the discrete distribution functions, repeating the above acts on each of the search targets, calculating, equipment by equipment for each process, a frequency distribution of the discrete-distribution-function weights according to the calculated weights and equipment history of each search target, calculating, for each process, a difference between the frequency distributions of discrete-distribution-function weights calculated equipment by equipment, and extracting processes and equipment related to the calculated differences in descending order of the calculated differences.

A ninth aspect of the present invention provides a program executable by computer, to achieve the method of the eighth aspect. The program at least includes taking one of search targets, entering data on imperfect entities present in the taken search target, calculating a frequency distribution of the imperfect entities in unit cells divided from the search target, approximating the frequency distribution by overlaying at least two discrete distribution functions, calculating weights of the discrete distribution functions, repeating the above acts until every one of the search targets is taken, calculating, equipment by equipment for each process, a frequency distribution of the discrete-distribution-function weights according to the calculated weights and equipment history of each search target, calculating, for each process, a difference between the frequency distributions of discrete-distribution-function weights calculated equipment by equipment, and extracting processes and equipment related to the calculated differences in descending order of the calculated differences.

A tenth aspect of the present invention provides an apparatus for identifying a problematic process and equipment. The apparatus at least includes a data memory that at least stores data on imperfect entities present in search targets each divided into unit cells and equipment history showing search targets and the processes and equipment that processed the search targets, a frequency distribution calculator that calculates, for each of the search targets according to the data on imperfect entities, a frequency distribution of imperfect entities in the unit cells, a discrete distribution function calculator that approximates each of the frequency distributions by overlaying at least two discrete distribution functions and calculating weights of the discrete distribution functions, a weight frequency distribution calculator that calculates, equipment by equipment for each process, a frequency distribution of the discrete distribution-function weights according to the calculated weights and the equipment history, and a difference calculator that calculates, for each process, a difference between the frequency distributions of discrete-distribution-function weights calculated equipment by equipment.

An eleventh aspect of the present invention provides a method of determining whether or not a search target must be scrapped. In a testing process carried out in semiconductor device manufacturing, the method at least includes evaluating the characteristics of semiconductor elements on the search target, detecting imperfect entities present in the search target, calculating a frequency distribution of the imperfect entities in unit cells divided from the search target, approximating the frequency distribution by overlaying at least two discrete distribution functions, calculating parameters related to the discrete distribution functions, calculating a yield from the search target according to the calculated parameters, and determining, according to the yield, whether or not the search target under manufacturing must be scrapped.

BRIEF DESCRIPTION OF THE SEVERAL VIEWS OF THE DRAWINGS

FIG. 1 is a flowchart showing a method of searching for clustering faults according to a principle of the embodiments of the present invention;

FIG. 2 is a block diagram showing an apparatus for searching for clustering faults according to a first embodiment of the present invention;

FIG. 3 is a flowchart showing a method of searching for clustering faults executed by the apparatus of FIG. 2;

FIG. 6 is a block diagram showing an apparatus for searching for clustering faults according to a second embodiment of the present invention;

FIG. 7 is a flowchart showing a method of searching for clustering faults executed by the apparatus of FIG. 6;

FIG. 12 is a flowchart showing a method of optimizing redundant circuits based on a method of searching for clustering faults according to a fourth embodiment of the present invention;

DETAILED DESCRIPTION OF THE INVENTION

Figure 4A:
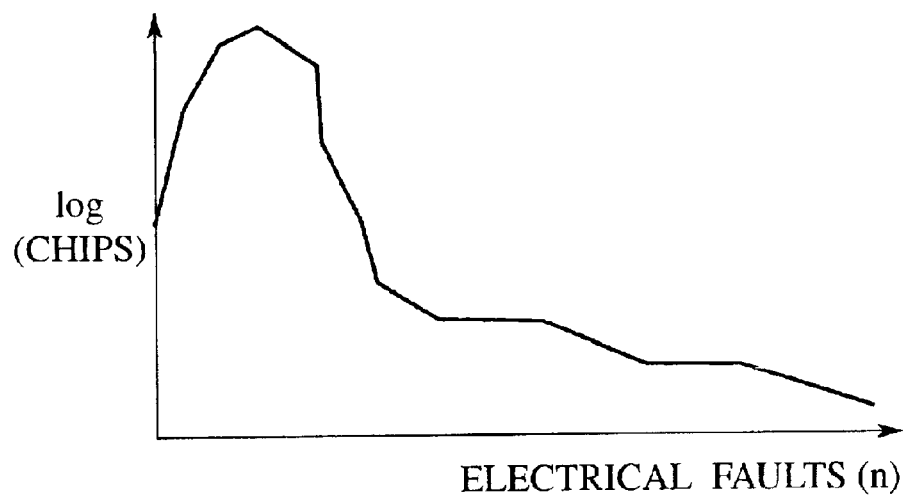
FIG. 4A is a graph showing a frequency distribution of electrical faults in chips calculated by a frequency distribution calculator in the apparatus of FIG. 2.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Basics

FIG. 1 is a flowchart showing a principle of a method of searching for clustering faults according to the embodiments of these present invention. Basic operations of the method will be explained.

(1) Step S100 enters data on imperfect entities present in a search target.

(2) Step S200 calculates a frequency distribution of the imperfect entities in unit cells divided from the search target.

(3) Step S300 approximates the frequency distribution of imperfect entities by overlaying at least two discrete distribution functions.

(4) Step S400 searches for clustering imperfect entities according to weights of the discrete distribution functions on the frequency distribution of imperfect entities.

The imperfect entities may correspond to electrical faults, the search target to a wafer, and the unit cells to chips divided from the wafer.

The data entered in step S100 relate to electrical faults present in the wafer and are used in step S200 to calculate a frequency distribution of electrical faults. The data may be the coordinates of electrical faults on the wafer, the numbers of electrical faults in the chips, the coordinates of the chips on the wafer, and a clustering faults criterion or threshold.

The frequency distribution of electrical faults calculated in step S200 is a graph having an abscissa representing the numbers of electrical faults in the chips and an ordinate representing the numbers of chips or the logarithms of the numbers of chips. The frequency distribution of electrical faults involve random faults in the wafer and clustering faults that are caused by a specific reason in the wafer.

The discrete distribution functions calculated in step S300 approximate the random and clustering faults, respectively. For example, the discrete distribution function approximating the random faults is a Poisson distribution, and the discrete function approximating the clustering faults is a negative binomial distribution. If the electrical faults in the wafer are mostly random faults and partly clustering faults, the frequency distribution prepared in step S200 may be approximated by overlaying a Poisson distribution and a negative binomial distribution.

In step S400, the frequency distribution of electrical faults is divided into the discrete distribution functions. These discrete distribution functions approximate the random electric faults spontaneously occurring in the wafer and the clustering electric faults caused by a specific reason in the wafer, respectively. Each of the discrete distribution functions has specific parameters including a weight on the frequency distribution, an average of electrical faults, and a clustering faults parameter. These parameters are used to determine whether or not the wafer involves clustering faults and identify chips having clustering faults.

When imperfect entities (electrical faults) are randomly present in a search target (wafer) and an average of electrical faults in each chip divided from the wafer $\lambda p$, a probability distribution of "n" electrical faults in each chip follows a Poisson distribution $P(n;\lambda p)$ as follows:

$$P(n;\lambda p)=\exp(-\lambda p)\times(\lambda p)^n/n! \quad (1)$$

The Poisson distribution, therefore, is effective to represent random electrical faults.

When there are clustering electrical faults in a wafer without random electrical faults, a probability distribution of "n" electrical faults in each chip divided from the wafer follows a negative binomial expression as follows:

$$NB(n;\lambda NB,\alpha)=A\cdot[\alpha/(\lambda NB+\alpha)]^\alpha[\lambda NB/(\lambda NB+\alpha)]^n \quad (2)$$

$$A=(\alpha+n-1)(\alpha+n-2)\ldots\alpha/n!$$

where $\lambda NB$ is an average of electrical faults in a chip and $\alpha$ is a clustering faults parameter. As $\alpha$ approaches 0, the degree of clustering increases to indicate a larger clustering of faults. As $\alpha$ increases, the degree of clustering decreases. When $\alpha$ approaches infinite, the negative binomial distribution agrees with a Poisson distribution. In this way, the negative binomial distribution is effective to represent clustering electrical faults. If there are mostly random electrical faults and partly clustering faults, a frequency distribution involving the two types of electrical faults is approximated by overlaying a Poisson distribution and a negative binomial distribution.

First Embodiment

A method of and an apparatus for determining whether or not a search target (wafer) involves clustering faults according to the first embodiment of the present invention will be explained. FIG. 2 is a block diagram showing the apparatus according to the first embodiment. The apparatus includes a process controller 1, a program memory 2, a data memory 3, an input unit 4 to enter data on electrical faults present in a wafer, an output unit 5, and a display 6 to display distribution shapes.

The process controller 1 includes functional units to search for clustering faults. The functional units include a frequency distribution calculator 7 to calculate, according to the data on electrical faults present in the wafer, a frequency distribution of the electrical faults based on chips divided from the wafer, a discrete distribution function calculator 8 to approximate the frequency distribution of electrical faults by overlaying at least two discrete distribution functions, and a clustering faults tester 9 to search for clustering faults according to a weight of the discrete distribution functions with respect to the frequency distribution of electrical faults. The data on electrical faults include the numbers of electrical faults in the chips and test conditions related to discrete-distribution-function weights used to test clustering faults. The discrete distribution functions include a Poisson distribution and a negative binomial distribution. The weight of the negative binomial distribution is used as a discrete-distribution-function weight to test clustering faults. The clustering faults tester 9 determines the presence of clustering faults in a wafer according to the test conditions. The test conditions include a conditional expression, i.e., an inequality concerning the weight of a negative binomial distribution. The presence of clustering faults in a wafer is determined according to whether or not the weight of a negative binomial distribution satisfies the conditional expression.

The input unit 4 and output unit 5 are used to provide a result of the clustering faults test and discrete-distribution-function parameters, store the result in an external file, retrieve stored data, etc. The display 6 is used to display the frequency distribution of electrical faults calculated by the frequency distribution calculator 7 and the shapes of the discrete distribution functions provided by the discrete distribution function calculator 8. Although the display 6 is separated from the output unit 5, they may be integrated into one. The program memory 2 stores computer programs including a clustering faults searching program according to the first embodiment of the present invention. The data memory 3 stores data required to search for clustering faults, such as the numbers of electric faults present in chips entered through the input unit 4 and discrete distribution-function weights.

The apparatus according to the first embodiment determines whether or not a target wafer involves clustering electrical faults if the wafer is determined to involve clustering electrical faults, the first embodiment may indicate a lot that contains the wafer, a manufacturing line that produced the wafer, and a factory that manufactured the wafer, to suggest a probability of clustering faults occurring in other wafers. Then, the user checks the manufacturing processes and lines concerned, to find a cause of the clustering faults and improve wafer processing.

The method of searching for clustering faults according to the first embodiment will be explained with reference to FIGS. 3 and 4. The method is executed with the apparatus of FIG. 2.

(1) Step S101 enters data on the numbers of electrical faults present in chips divided from a wafer. Step S102 enters test conditions related to a negative-binomial-distribution weight used to find clustering faults. Steps S101 and S102 are carried out through the input unit 4. Any one of steps S101 and S102 may precedes the other. The data on the numbers of electrical faults and test conditions are stored in the data memory 3.

(2) According to the numbers of electrical faults in the chips, step S200 calculates a frequency distribution of electrical faults in the chips. FIG. 4A is a graph showing the frequency distribution of electrical faults calculated in step S200 and displayed on the display 6. In FIG. 4A, an abscissa represents the numbers of electrical faults and an ordinate represents the logarithms of the numbers of chips, to show the numbers of chips at set intervals of the numbers of electrical faults. In an area where the numbers of electrical faults are relatively small, there are many chips to form a large peak. In an area where the numbers of electrical faults are relatively large, the numbers of chips are small and gradually decrease. The area where the numbers of electrical faults are small involves random electrical faults, and the area where the numbers of electrical faults are large involves clustering faults caused by a specific reason. Namely, FIG. 4A indicates that the electrical faults are mostly random and partly clustering. The reason why the ordinate represents the logarithms of the numbers of chips is to emphasize the tail area where the numbers of electrical faults are large.

Figure 4B:
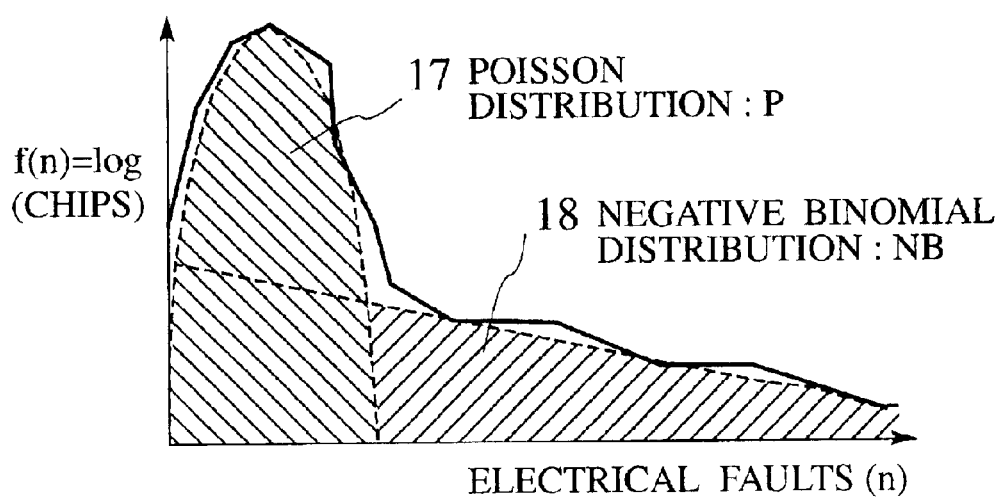
FIG. 4B is a graph showing a Poisson distribution and a negative binomial distribution calculated by a discrete distribution function calculator in the apparatus of FIG. 2, to approximate the frequency distribution of FIG. 4A.

(3) Step S300 approximates the frequency distribution of electrical faults by overlaying a Poisson distribution and a negative binomial distribution. The Poisson distribution approximates the random electrical faults in the wafer, and the negative binomial distribution approximates the clustering faults in the wafer. More precisely, the frequency distribution $f(n)$ of electrical faults is approximated by overlaying a Poisson distribution $P(n;\lambda p)$ and a negative binomial distribution $NB(n;\lambda NB, \alpha)$ as follows:

$$f(n)=Wp \times P(n;\lambda p)+WNB \times NB(n;\lambda NB, \alpha) \qquad (3)$$

where Wp is a Poisson-distribution weight indicating the ratio of the Poisson distribution to the frequency distribution, and WNB is a negative-binomial-distribution weight indicating the ratio of the negative binomial distribution to the frequency distribution. Here, Wp+WNB=1. FIG. 4B is a graph showing the frequency distribution of electrical faults approximated by overlaying the Poisson distribution and negative binomial distribution. The Poisson distribution 17 approximates an area of the frequency distribution where the numbers of electrical faults are relatively small, and the negative binomial distribution 18 approximates a tail area of the frequency distribution where the numbers of electrical faults are relatively large. In this way, the frequency distribution $f(n)$ is divided into the Poisson distribution $P(n;\lambda p)$ and the negative binomial distribution $NB(n;\lambda NB, \alpha)$. The Poisson distribution approximates the random electrical faults in the wafer, and the negative binomial distribution approximates the clustering faults caused by a specific reason in the wafer. The Poison distribution and negative binomial distribution have, in addition to the weights indicating the ratios thereof to the frequency distribution, average values ($\lambda p$, $\lambda NB$) of electrical faults (imperfect entities), a clustering faults parameter $\alpha$, and other parameters.

(4) Step S401 determines whether or not there are clustering faults in the wafer according to the test conditions. If Wp=1 and WNB=0 in the expression (3), $f(n)=P(n;\lambda p)$ to indicate that all electrical faults are distributed according to the Poisson distribution. Namely, all electrical faults are randomly present in the wafer without clustering faults. If Wp<1 and WNB>0, there are clustering faults in the ratio of the weight WNB of the negative binomial distribution. Namely, part of the electrical faults are clustering faults. In this case, the degree of clustering corresponds to the weight WNB of the negative binomial distribution.

The test conditions entered in step S102 include a threshold negative-binomial-distribution weight WNB(th), which is 0.1 (10%) in this embodiment. If WNB<=WNB(th) in step S401, it is determined that there are no clustering electrical faults, and if WNB>WNB(th), it is determined that there are clustering electrical faults. Instead of WNB(th), a threshold Poisson-distribution weight Wp(th) maybe entered in step S102. In this case, Wp(th)=1−WNB(th)=0.9 (90%). If Wp >Wp(th) in step S401, it is determined that there are no clustering faults, and if Wp<=Wp(th), it is determined that there are clustering faults. Alternatively, the test conditions may include a threshold set for the clustering faults parameter $\alpha$. Through the operations mentioned above, the target wafer is tested to see if it has clustering electrical faults, and a result of the test is provided.

The clustering faults searching method according to the first embodiment may be expressed as processes or procedures that are connected to one another in time series. Namely, the method is expressible as a computer program to specify functions executed by processors, etc., in a computer system. The computer program may be stored in a storage medium to be read by a computer. The program in the storage medium is read by a computer, which executes the clustering faults searching method described in the program. The storage medium may be used as the program memory 2 of FIG. 2. The program in the storage medium may be transferred into the program memory 2, so that the process controller 1 may execute operations according to the program. The storage medium is, for example, a memory, a magnetic disk, an optical disk, or any other medium capable of storing computer programs.

Figure 5:
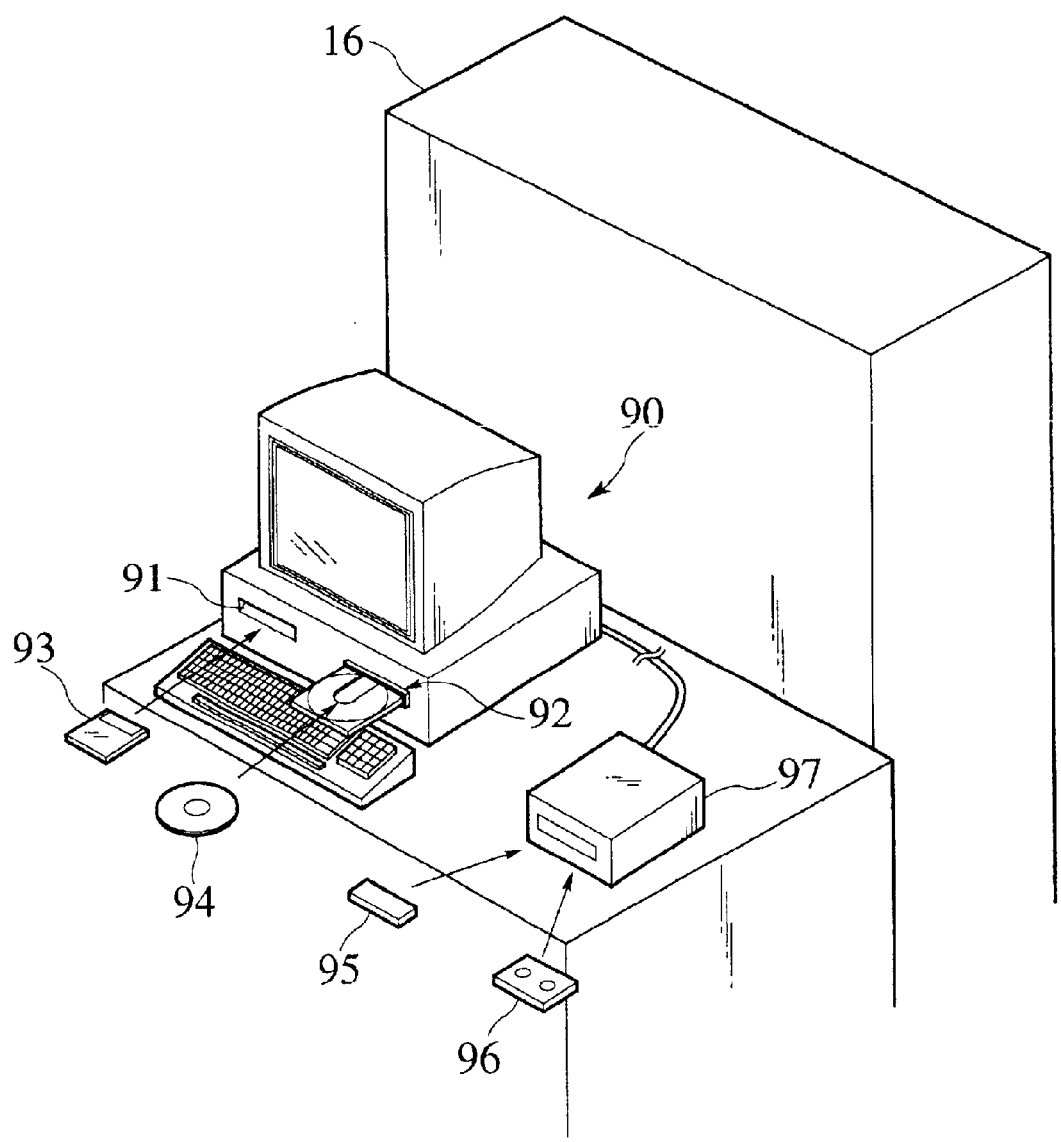
FIG. 5 shows an example of an apparatus for searching for clustering faults according to an embodiment of the present invention, the apparatus being a computer system that reads a clustering faults searching program based on the embodiments of the present invention stored in a storage medium.

FIG. 5 shows an example of a computer system serving as a clustering faults searching apparatus 90 according to embodiments of the present invention. The apparatus 90 reads the computer program describing the clustering faults searching method of the first embodiment and executes the method. The apparatus 90 includes a floppy disk drive 91 and a CD-ROM drive 92. A magnetic floppy disk 93 and an optical CD-ROM 94 are inserted into the drives 91 and 92, respectively. The disks 93 and 94 store computer programs including the clustering faults searching program and are read by the apparatus 90, to install the programs in the apparatus 90. A drive 97 for handling a storage medium such as a ROM 95 serving as, for example, a game pack and a magnetic cassette tape 96 that can store the clustering faults searching program may be connected to the apparatus 90.

In this way, the first embodiment approximates a frequency distribution of electrical faults with a Poisson distribution and a negative binomial distribution. Namely, the first embodiment divides the frequency distribution into the Poisson distribution and negative binomial distribution. The negative binomial distribution approximates clustering electrical faults caused by a specific reason in a target such as a wafer. According to a weight of the negative binomial distribution, the first embodiment quantitatively determines the presence of clustering electrical faults.

Although the first embodiment handles electrical faults as imperfect entities, this does not limit the first embodiment. The imperfect entities may be electrical faults and defects in a layer, flows in a layer, redundant circuits, etc. The electrical faults may include bit faults, margin faults, wire-to-wire shorts, opens, block faults, etc., that are detectable through function tests, margin tests, leak tests, etc. The first embodiment may handle all or part of these faults as imperfect entities to be found in a target. The target may be made of one or a plurality of layers part or all of which may involve imperfect entities. The imperfect entities include those detectable by fault detectors and those hardly detectable by fault detectors. For example, the imperfect entities include those buried in layered films and those caused by metal contamination. The imperfect entities may be present wholly or party on or in a target made of one or a plurality of layers. The imperfect entities include not only electrical faults and defects occurring on semiconductor chips but also those occurring on peripheral devices of the semiconductor chips. The peripheral devices include resin packages that may involve cracks as imperfect entities, bonding wires that may involve breaks as imperfect entities, and lead frames that may involve open and short faults as imperfect entities.

Although the first embodiment employs a wafer as a search target, this does not limit the first embodiment. According to the first embodiment, the search target may be a lot, a manufacturing line, or a manufacturing factory. Although the first embodiment employs chips as unit cells, this does not limit the first embodiment. According to the first embodiment, the unit cells may be blocks divided from a chip, groups each containing chips, shot areas serving as lithographical operation units, wafers, lots, etc. The size of each unit cell must be smaller than the size of a search target from which the unit cells are divided. If the search target is a wafer, the unit cells divided from the search target will be groups, chips, blocks, or shot areas.

As shown in FIGS. 4A and 4B, the first embodiment approximates electrical faults composed of mostly random faults and partly clustering faults with a Poisson distribution and a negative binomial distribution. If required, the first embodiment may employ at least two Poisson distributions having different average values and at least two negative binomial distributions having different clustering faults parameters, to approximate a frequency distribution of electrical faults. Employing at least two Poisson distributions is effective to handle random faults caused by at least two reasons, and employing two negative binomial distributions is effective to handle clustering faults caused by at least two reasons. Approximating a frequency distribution of electrical faults by overlaying two Poisson distributions of different average values is as follows:

$$f(n) = Wp1 \times P(n; \lambda p1) + Wp2 \times P(n; \lambda p2) \quad (4)$$

$$Wp1 + Wp2 = 1$$

The expression (4) is effective to study a relative ratio between the causes of random electric faults. To employ the expression (4), step S102 may set a criterion so that step S401 may issue an alarm if the weight of a Poisson distribution with a larger average increases above the criterion. Approximating a frequency distribution of electrical faults by overlaying two negative binomial distributions with different average values $\lambda$ and different clustering faults parameters $\alpha$ is as follows:

$$f(n) = WNB1 \times NB(n; \lambda NB1, \alpha 1) + WNB2 \times NB(n; \lambda NB2, \alpha 2) \quad (5)$$

$$WNB1 + WNB2 = 1$$

The expression (5) is effective to study a relative ratio between clustering faults of smaller degree and clustering faults of larger degree. Approximating clustering faults of smaller degree is made with a negative binomial distribution of larger clustering faults parameter $\alpha$, and approximating clustering faults of larger degree is made with a negative binomial distribution of smaller clustering faults parameter $\alpha$. Step S102 may set a criterion so that step S401 may issue an alarm if the weight of a negative binomial distribution of smaller clustering faults parameter $\alpha$ increases above the criterion. It is also possible to employ at least three discrete distribution functions to approximate a frequency distribution of electrical faults. For example, two Poisson distributions and a negative binomial distribution may approximate a frequency distribution of electrical faults as follows:

$$f(n) = Wp1 \times P(n; \lambda p1) + Wp2 \times P(n; \lambda p2) + WNB \times NB(n; \lambda NB, \alpha) \quad (6)$$

$$Wp1 + Wp2 + WNB = 1$$

Second Embodiment

A method of and an apparatus for searching for clustering faults according to the second embodiment of the present invention will be explained. The second embodiment employs a clustering faults threshold specifying the number of clustering electrical faults and picks up each unit cell (chip) whose number of electrical faults is greater than the clustering faults threshold.

FIG. 6 is a block diagram showing the apparatus according to the second embodiment. The apparatus has a process controller 10, a program memory 2, a data memory 3, an input unit 4 to enter data on electrical faults present in a wafer, an output unit 5, a display 6 to display distribution shapes, and a display 13 to display the locations of clustering faults. Compared with the apparatus of FIG. 2, the process controller 10 and display 13 are new in the apparatus of FIG. 6. The input unit 4 enters not only the numbers of electrical faults present in chips divided from a wafer but also the coordinates of the chips on the wafer.

The process controller 10 includes functional units to search for clustering faults. The functional units include a frequency distribution calculator 7, a discrete distribution function calculator 8, a clustering faults threshold calculator 11, and a clustering faults searcher 12. Compared with the process controller 1 of FIG. 2, the clustering faults threshold calculator 11 and clustering faults searcher 12 are new in the process controller 10. The clustering faults threshold calculator 11 calculates the number of electrical faults at which the components of at least two discrete distribution functions are equalized to each other. In this embodiment, the clustering faults threshold calculator 11 calculates the number of electrical faults where a Poisson-distribution component and a negative-binomial-distribution component are equalized to each other. The Poisson-distribution component is the first term "Wp×P(n;λp)" of the right side of the expression (3), and the negative-binomial-distribution component is the second term "WNB×NB(n;λNB, α)" of the right side of the equation (3). The number of electrical faults thus calculated is used as a clustering faults threshold serving as a criterion to search for clustering faults. The clustering faults searcher 12 searches for any chip whose number of electrical faults is greater than the clustering faults threshold. The display 13 displays the coordinates of the searched chips on the wafer. Namely, the display 13 displays the locations of the searched chips on a wafer map.

The clustering faults searching method according to the second embodiment executed by the apparatus of FIG. 6 will be explained with reference to FIGS. 7 and 8.

(1) Step S103 enters data on the numbers of electrical faults present in chips divided from a wafer and the coordinates of the chips on the wafer. To enter the data, step S103 employs the input unit 4. The numbers of electrical faults and the chip coordinates are linked to each other and are stored in the data memory 3.

Figure 8A:
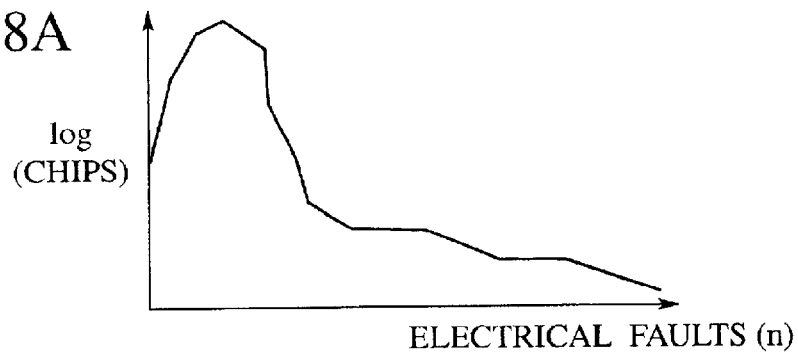
FIG. 8A is a graph showing a frequency distribution of electrical faults in chips calculated by a frequency distribution calculator in the apparatus of FIG. 6.

(2) According to the numbers of electrical faults in the chips, step S200 calculates a frequency distribution of the electrical faults in the chips as shown in FIGS. 4A and 8A. In the example of FIG. 8A, the electrical faults are mostly random faults and partly clustering faults.

Figure 8B:
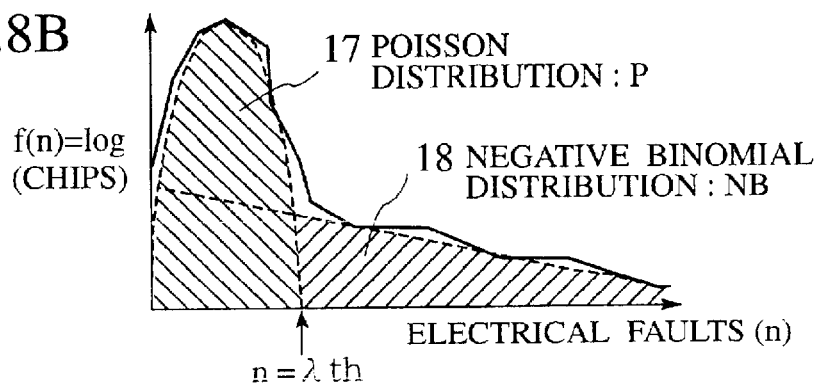
FIG. 8B is a graph showing a Poisson distribution and a negative binomial distribution calculated by a discrete distribution function calculator in the apparatus of FIG. 6, to approximate the frequency distribution of FIG. 8A.

(3) Step S300 approximates the frequency distribution of electrical faults by overlaying a Poisson distribution and a negative binomial distribution. More precisely, the frequency distribution f(n) of electrical faults is approximated by overlaying a Poisson distribution $P(n;\lambda p)$ and a negative binomial distribution $NB(n;\lambda NB, \alpha)$ according to the expression (3). According to the second embodiment, the Poisson distribution 17 approximates an area of the frequency distribution where the numbers of electrical faults are relatively small, and the negative binomial distribution 18 approximates a tail area of the frequency distribution where the numbers of electrical faults are relatively large as shown in FIGS. 4B and 8B. Consequently, the frequency distribution f(n) of electrical faults is divided into the Poisson distribution $P(n;\lambda p)$ and the negative binomial distribution $NB(n;\lambda NB, \alpha)$.

Figure 8C:
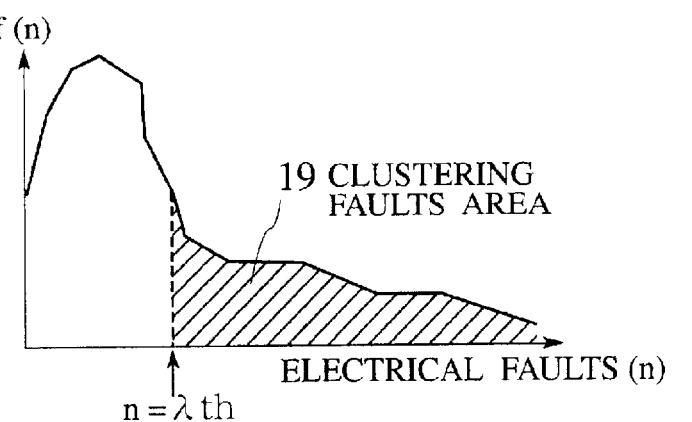
FIG. 8C is a graph showing a clustering faults area in the frequency distribution of FIG. 8A.

(4) Step S402 calculates a clustering faults threshold $\lambda$th representing the number of electrical faults where the Poisson-distribution component and negative-binomial-distribution component are equalized to each other. The reason why the number of electrical faults where the Poisson-distribution component and negative-binomial-distribution component are equalized to each other functions as a clustering faults threshold will be explained. In an area where the number "n" of electrical faults is greater than an average value $\lambda p$ of a Poisson distribution $P(n;\lambda p)$, probabilities based on the Poisson distribution $P(n;\lambda p)$ rapidly approach zero as the number "n" of electrical faults increases from the average value $\lambda p$. On the other hand, a negative binomial distribution $NB(n;\lambda NB, \alpha)$ slowly approaches zero and trails compared with the Poisson distribution $P(n;\lambda p)$, if the clustering faults parameter $\alpha$ is properly small. In FIG. 8C, the trailing part of the negative binomial distribution $NB(n;\lambda NB, \alpha)$ corresponds to a clustering faults area 19. Accordingly, the number of electrical faults where the Poisson-distribution component of the first term of the right side of the expression (3) and the negative-binomial-distribution component of the second term of the right side of the expression (3) are equalized to each other is calculated as follows:

$$Wp \times P(n;\lambda p) = WNB \times NB(n;\lambda NB, \alpha) \qquad (7)$$

The number "n" satisfying the expression (7) is used as the clustering faults threshold $\lambda$th to determine whether or not there are clustering faults. The number n (an integer) of electrical faults strictly satisfying the expression (7) is not always found. In this case, the number of electrical faults closest to the value satisfying the expression (7) is used as the clustering faults threshold $\lambda$th. The clustering faults threshold $\lambda$th may have a margin with respect to the value satisfying the expression (7). For example, the clustering faults threshold $\lambda$th may be in the range of 0.5 times to 2 times the value satisfying the expression (7). The clustering faults threshold $\lambda$th varies depending on wafers or lots that have different frequency distributions of faults. If this is inconvenient, a fixed clustering faults threshold may be employed. Employing the fixed clustering faults threshold enables the user to compare the locations of clustering faults among lots or wafers. Based on the clustering faults threshold $\lambda$th set in step S402, step S403 picks up chips involving electrical faults greater than the clustering faults threshold $\lambda$th.

There maybe a plurality of values that satisfy the expression (7). For example, the graph of FIG. 8B satisfies the expression (7) at n=$\lambda$th and at nearly zero. In this case, the clustering faults threshold $\lambda$th is determined according to the sizes of $Wp \times P(n;\lambda p)$ and $WNB \times NB(n;\lambda NB, \alpha)$. In an area where the numbers of electrical faults are smaller than the value satisfying the expression (7), the Poisson-distribution component "$Wp \times P(n;\lambda p)$" is greater than the negative-binomial-distribution component "$WNB \times NB(n;\lambda NB, \alpha)$." In an area where the numbers of electrical faults are greater than the value satisfying the expression (7), the negative-binomial-distribution component is greater than the Poisson-distribution component. If there are a plurality of values that satisfy the expression (7), the clustering faults threshold $\lambda$th is determined to satisfy the following expressions (8) and (9) in addition to the expression (7):

with n<$\lambda$th, $$Wp \times P(n;\lambda p) > WNB \times NB(n;\lambda NB, \alpha) \qquad (8)$$

with n>$\lambda$th, $$Wp \times P(n;\lambda p) < WNB \times NB(n;\lambda NB, \alpha) \qquad (9)$$

Figure 8D:
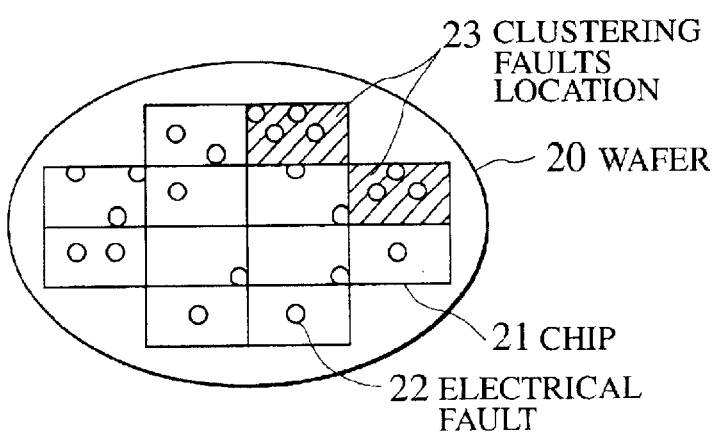
FIG. 8D is a wafer map showing chips involving clustering faults.

(5) Step S403 picks up chips that are present in the clustering faults area 19 where each chip involves clustering faults greater than the clustering faults threshold $\lambda$th. The coordinates of the picked-up chips are displayed on the display 13. Instead, the locations of the chips 21 corresponding to the clustering faults locations 23 on the wafer 20 are displayed as shown in FIG. 8D. If the clustering faults locations 23 are present at the periphery of the wafer 20, it is suggested that equipment corresponding to the periphery of the wafer 20 has caused the clustering faults. Then, the user inspects the equipment to find the cause of the clustering faults. If the electrical faults entered in step S103 are sorted layer by layer, the cause of the clustering faults will be detectable more precisely.

The clustering faults searching method of the second embodiment is describable as a computer program that specifies the functions of processors, etc., in a computer system, to make the computer system execute the method. This computer program may be stored in a storage medium to be read by a computer. The storage medium is employable as the program memory 2 of FIG. 6. The program in the storage medium may be transferred into the program memory 2, so that the process controller 10 may execute operations according to the program. The clustering faults searching apparatus 90 of FIG. 5 consisting of a computer system may be employed to read the computer program stored in the storage medium and achieve the clustering faults searching method of the second embodiment according to procedures described in the program.

The second embodiment enters the numbers of electrical faults present in chips divided from a wafer and the coordinates of the chips on the wafer and searches the wafer for the locations of clustering electrical faults. The second embodiment displays the searched locations of clustering electrical faults, so that the user may clarify the cause of the clustering electrical faults.

Like the first embodiment, the second embodiment may approximate a frequency distribution of electrical faults not only by overlaying a Poisson distribution and a negative binomial distribution but also by overlaying at least two Poisson distributions and at least two negative binomial distributions. In the latter case, the second embodiment may display, on a wafer map, a location where the weight of any one of the discrete distribution functions increases, so that the user may identify the cause of clustering faults.

Figure 9:
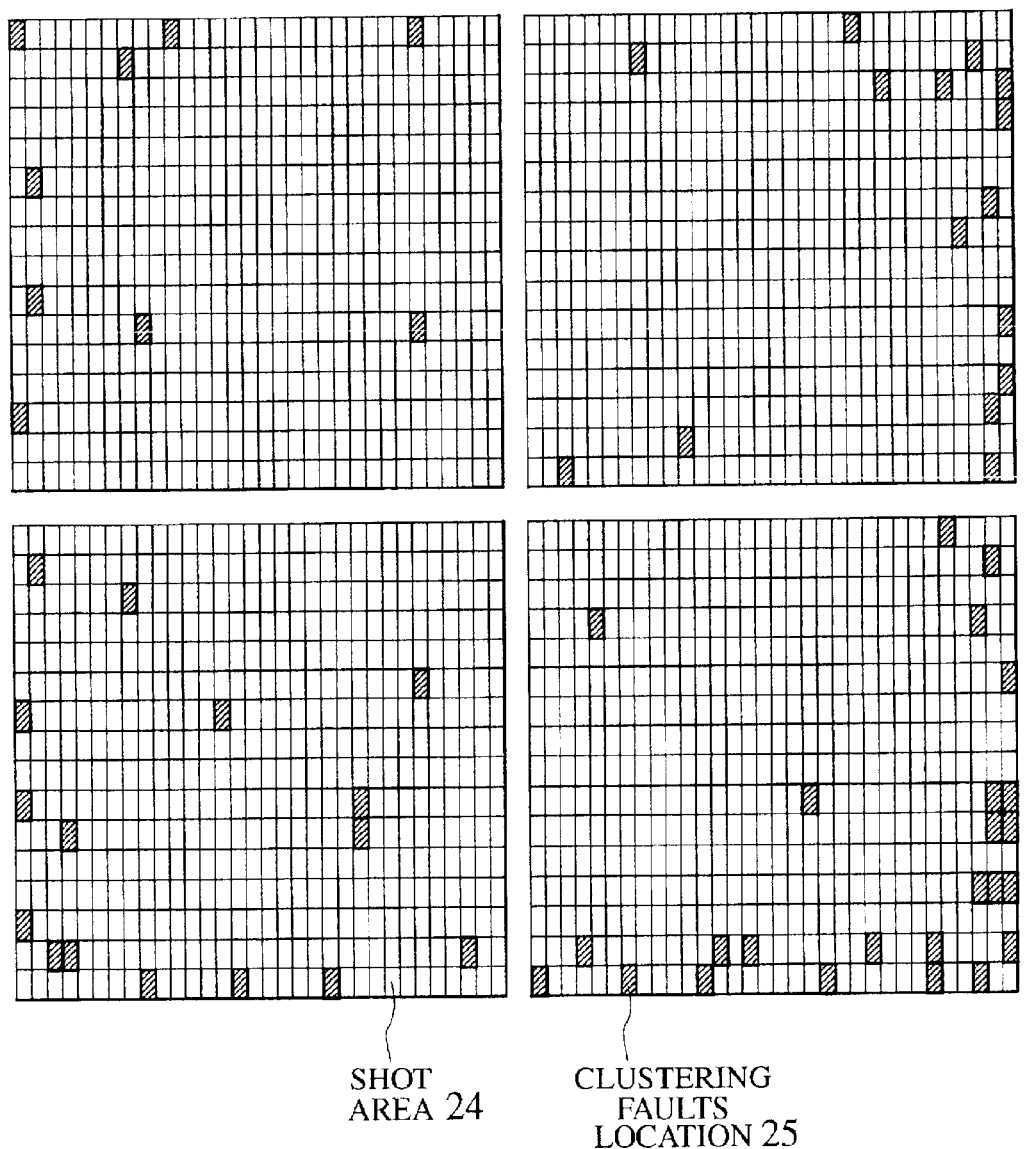
FIG. 9 is a wafer map showing shot areas serving as unit cells and involving clustering faults.

Although the second embodiment employs a wafer as a search target and chips divided from the wafer as unit cells, this does not limit the second embodiment. According to the second embodiment, the search target may be a lot, a manufacturing line, and a manufacturing factory, and the unit cells may be blocks divided from a chip, groups each containing chips, shot areas serving as lithographical operation units, wafers, lots, etc. FIG. 9 is a wafer map showing shot areas serving as unit cells and involving clustering faults. This wafer map is displayed on the display 13. On the wafer map, white shot areas 24 involve no clustering electrical faults, and hatched shot areas 25 involve clustering electrical faults exceeding a clustering faults threshold. The wafer map indicates that the clustering faults are occurring at the periphery of the wafer. Inspecting the wafer map, the user may understand that the cause of the clustering faults may preside at the periphery of a lens of a lithography system, and then, may try to remove the cause. The first and second embodiments may be combined together to determine the presence of clustering faults and display the locations of clustering faults.

Third Embodiment

The first and second embodiments prepare, in advance, data on the numbers of electrical faults in chips and the coordinates of the chips on a wafer. These data pieces are necessary to calculate a frequency distribution of the electrical faults. The electrical faults are usually detected by a tester, a fault detector, an EMS, etc. The raw data from the detecting device indicates the nature and location of each electrical fault and must be converted into data usable to calculate a frequency distribution of the electrical faults. This data conversion is useful for the embodiments of the present invention because it simplifies the handling of the data and compresses the data.

The third embodiment of the present invention provides a method of and an apparatus for searching for clustering faults, provided with a faults data converting function. Like the first embodiment, the third embodiment employs a wafer as a search target in which clustering faults, in particular, electrical faults are searched for.

Figure 10:
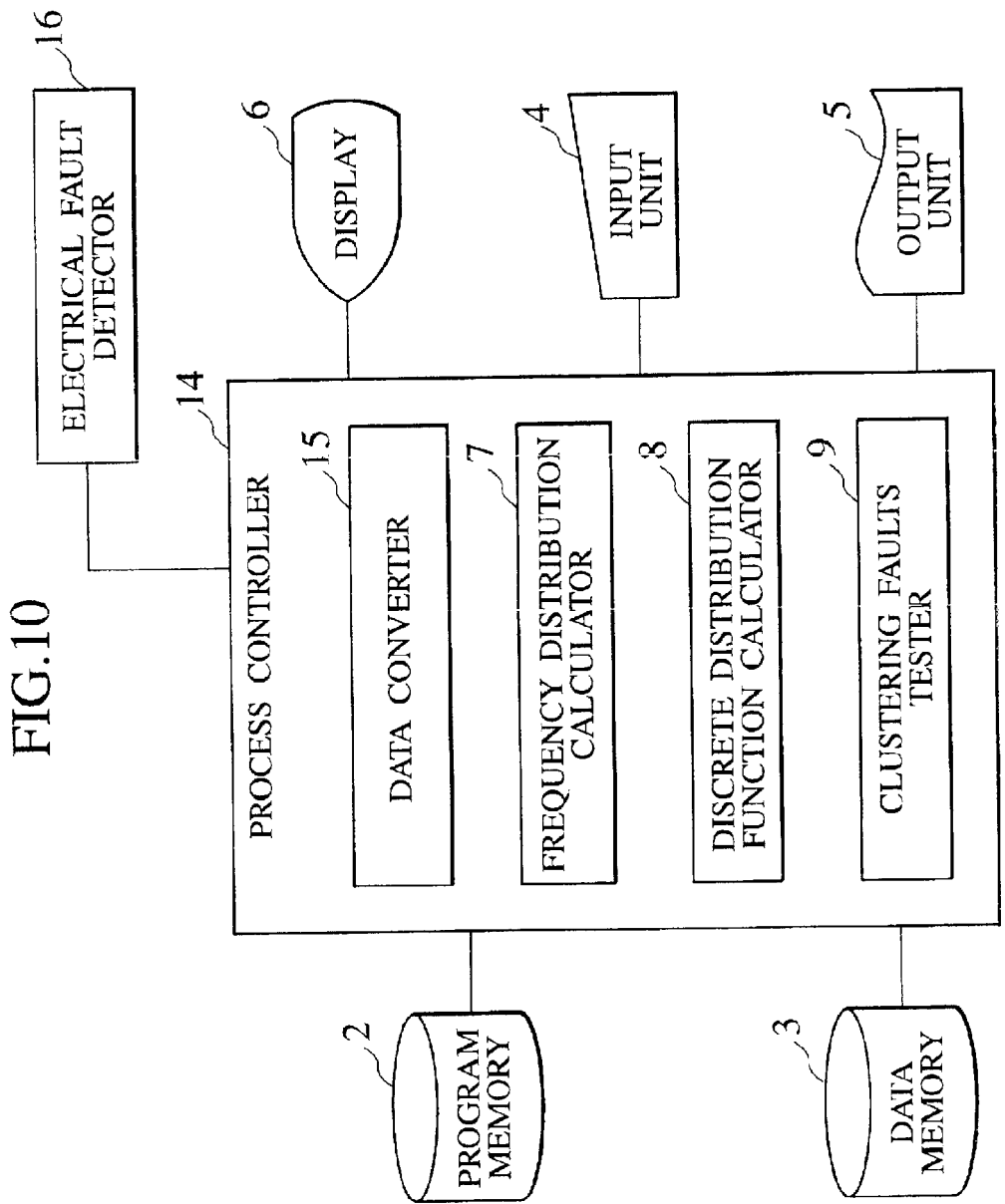
FIG. 10 is a block diagram showing an apparatus for searching for clustering faults according to a third embodiment of the present invention.

FIG. 10 is a block diagram showing an exemplary structure of the clustering faults searching apparatus according to the third embodiment. The apparatus has a process controller 14, a program memory 2, a data memory 3, an input unit 4, an output unit 5, a display 6, and an electrical fault detector 16. Compared with the apparatus of FIG. 2, the process controller 14 and electrical fault detector 16 are new in the apparatus of FIG. 10. The input unit 4 enters a clustering faults criterion or threshold. Unlike the first and second embodiments, the input unit 4 does not enter the numbers of electrical faults present in chips divided from a wafer, or the coordinates of the chips on the wafer.

The electrical fault detector 16 employs an electrical or optical technique to detect electrical faults present in a wafer and provides the coordinates of the detected electrical faults on the wafer. The detector 16 is, for example, a tester, an electron beam (EB) tester, an emission microscope (EMS), or an electron microscope. The process controller 14 includes functional units to search for clustering faults. The functional units include a data converter 15, a frequency distribution calculator 7, a discrete distribution function calculator 8, and a clustering faults tester 9. Compared with the process controller 1 of FIG. 2, the data converter 15 is new in the process controller 14. The data converter 15 converts the coordinates of electrical faults provided by the detector 15 into the numbers of electrical faults in the chips. According to the converted numbers of electrical faults, the frequency distribution calculator 7 calculates a frequency distribution of the electrical faults.

Like the first embodiment the third embodiment determines the presence of clustering electrical faults on a wafer. If the wafer is determined to involve clustering faults, the user will understand that the lot or manufacturing line that provided the wafer, or other lots in the manufacturing factory that provided the wafer may have the cause of the clustering electrical faults. Then, the user inspects the manufacturing line and factory for the cause of the clustering faults and remove the cause.

Figure 11:
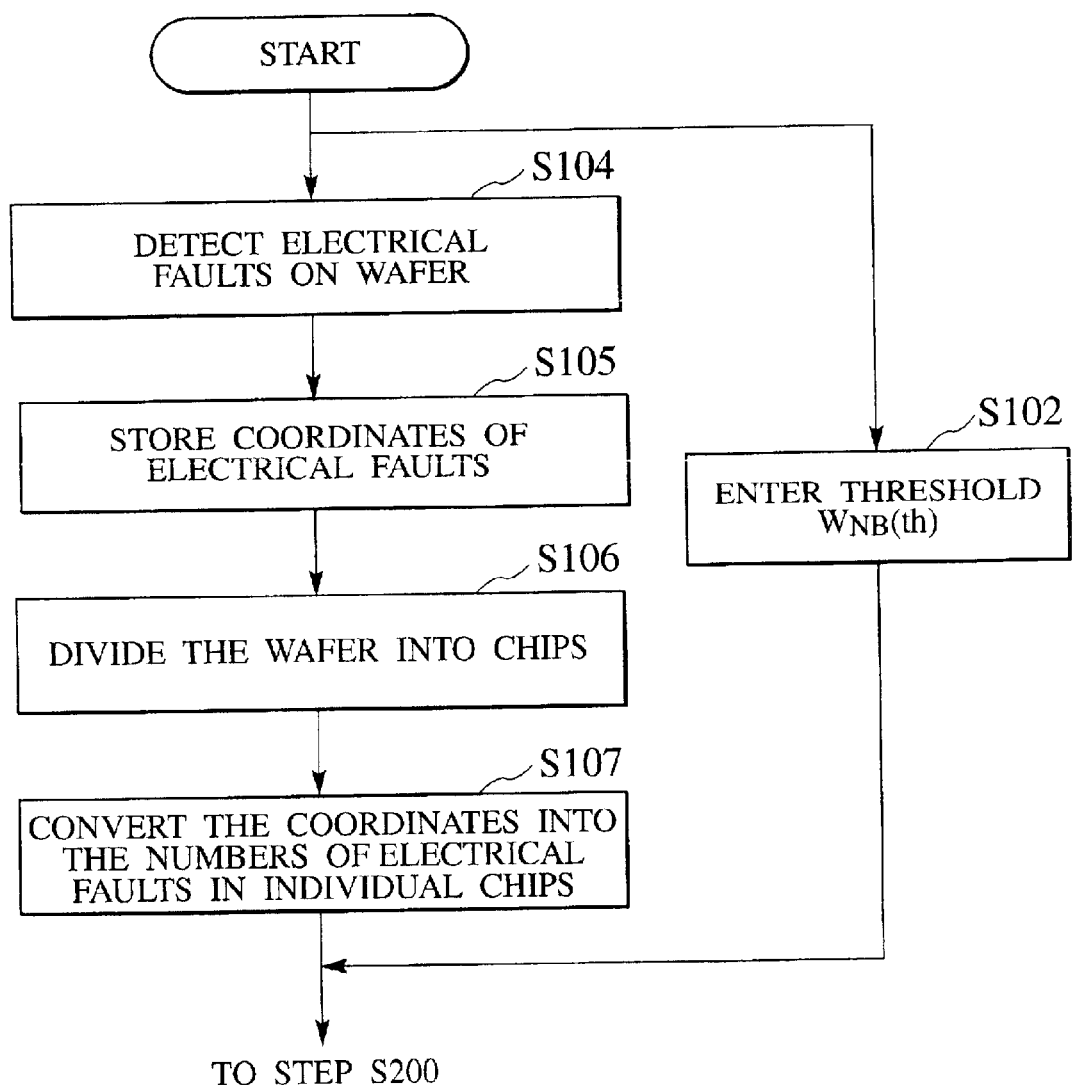
FIG. 11 is a flowchart partly showing a method of searching for clustering faults executed by the apparatus of FIG. 10.

The clustering faults searching method according to the third embodiment will be explained with reference to FIG. 11, which partly shows the method. This method is executed by the apparatus of FIG. 10.

(1) In step S104, the detector 16 detects electrical faults on a wafer and provides the coordinates of the detected electrical faults on the wafer.

(2) Step S105 stores the coordinates from the detector 16 in the data memory 3.

(3) Step S106 divides the wafer into chips.

(4) Step S107 reads the coordinates of the electrical faults from the data memory 3 and employs the data converter 15 to convert the read data into the numbers of electrical faults in the chips. The converted data are directly transferred to the frequency distribution calculator 7 or are temporarily stored in the data memory 3. Then, step S200 of FIG. 3 is carried out.

(5) Separately five steps S104 to S107, step S102 enters a clustering faults criterion or threshold through the input unit 4.

(6) Step S200 of FIG. 3 uses the converted data directly transferred to the frequency distribution calculator 7 or temporarily stored in the data memory 3, to calculate a frequency distribution of the electrical faults in the chips.

(7) According to the flowchart of FIG. 3, clustering faults are found and displayed.

Like the first and second embodiments, the clustering faults searching method of the third embodiment is describable as a computer program. The computer program may be stored in a computer readable storage medium. The clustering faults searching apparatus 90 of FIG. 5 consisting of a computer system may be employed to read the computer program stored in the storage medium and achieve the clustering faults searching method of the third embodiment according to procedures described in the program. The computer system of the apparatus 90 is directly connected to the electrical fault detector 16. The detector 16 has the functions of, for example, observing a wafer, detecting electrical faults in the wafer, and transmitting/receiving the coordinates of the detected electrical faults. These functions of the detector 16 are controlled by the computer system.

The third embodiment of the present invention employs the coordinates of electrical faults detected by the detector 16, to count the numbers of the electrical faults in individual chips, thereby converting the coordinates into the numbers of faults. With this technique, the third embodiment avoids the direct handling of the coordinates of faults and compresses data to handle. According to the converted numbers of faults, the third embodiment prepares a frequency distribution of the faults in individual chips and quantitatively determines the presence of clustering faults, like the first embodiment.

The computer system including the electrical fault detector 16 of FIG. 5 may be arranged in a semiconductor device manufacturing line, to always inspect electrical faults on semiconductor wafers, quantitatively find clustering faults in the wafers, and allow the user to take quick actions against the clustering faults.

Although the third embodiment determines the presence of clustering faults in a wafer like the first embodiment, the third embodiment is also applicable to determine the locations of clustering faults like the second embodiment of FIGS. 6 and 7. In this case, the process controller 10 of FIG. 6 is connected to the electrical fault detector 16 and incorporates the data converter 15. In addition, the numbers of electrical faults and the coordinates of chips provided by step S103 of FIG. 7 of the second embodiment are calculated in steps S104 to S107 of FIG. 11 of the third embodiment.

Although the third embodiment employs a wafer as a search target and chips divided from the wafer as unit cells, this does not limit the present invention. According to the present invention, the search target may be a lot, a manufacturing line, and a manufacturing factory, and the unit cells may be blocks divided from a chip, groups each containing chips, shot areas serving as lithographical operation units, wafers, lots, etc. When inspecting a manufacturing line, the search target is preferably a lot, as will be explained in the fifth embodiment. Although the imperfect entities are electrical faults in the third embodiment, they may be crystal defects, redundant circuits replaced with electrical faults, etc. If the imperfect entities are crystal defects, the electrical fault detector 16 of FIG. 10 will be replaced with a defect observer.

Fourth Embodiment

The fourth embodiment of the present invention applies the clustering faults searching method of the embodiments to a method of optimizing redundant circuits. The redundant circuits are used to repair electrical faults present in a wafer, although whether or not an electrical fault is relievable is dependent on the nature of the electrical fault. If all electrical faults in a chip are repaired, the chip will be accepted as a final product, to improve the yield of semiconductor devices. The redundant circuits, however, need some space in a chip, and therefore, increase the area of the chip. Unreasonably increasing the redundant circuits will uselessly increase chip areas, to reduce the number of chips producible from a wafer. It is necessary, therefore, to set a proper number of redundant circuits, to optimize yield after repair.

The numbers of redundant circuits are counted based on calculation units, and a frequency distribution of the redundant circuits is prepared in the calculation units. The "calculation unit" is preferable to be a minimum repair unit. The "minimum repair unit" is a range (the degree of freedom) to be repaired by a redundant circuit. For example, if a 16-megabit device has a row or column redundant circuit for every 4 megabits and if each redundant circuit is applicable only for the 4-megabit range, the minimum repair unit is the 4-megabit range. The calculation unit is not always the minimum repair unit. In this case, the minimum repair unit is scaled to the calculation unit, to execute the embodiments of the present invention. In the following explanation, the calculation unit is a chip. Namely, the fourth embodiment handles a redundant circuit as an imperfect entity, a wafer as a search target, and a chip as a unit cell or the calculation unit. The fourth embodiment will be explained with reference to FIGS. 12 and 13A to 13D.

(1) Step S31 calculates the number of redundant circuits necessary for relieving electrical faults present in a chip divided from a wafer. More precisely, steps S104 to S107 of FIG. 11 obtain the numbers of electrical faults. According to the obtained numbers, the numbers of redundant circuits required for individual chips are calculated and are entered through an input unit.

Figure 13A:
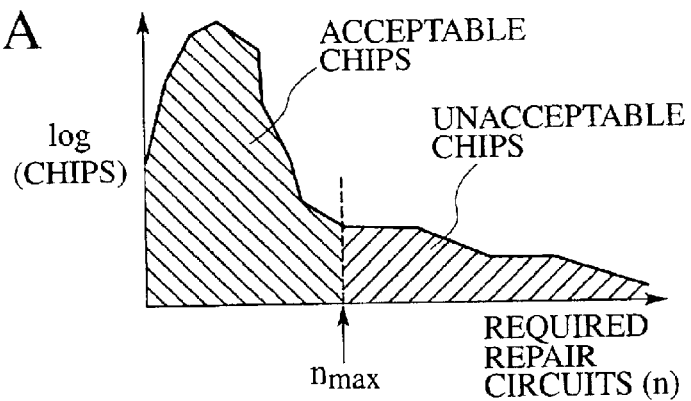
FIG. 13A is a graph showing a frequency distribution of redundant circuits in chips.

(2) Step S32 calculates a frequency distribution of the redundant circuits of the individual chips. FIG. 13A is a graph showing an example of the frequency distribution of redundant circuits calculated in step S32. On the graph, an abscissa represent the numbers of redundant circuits and an ordinate represents the logarithms of the numbers of chips.

Figure 13B:
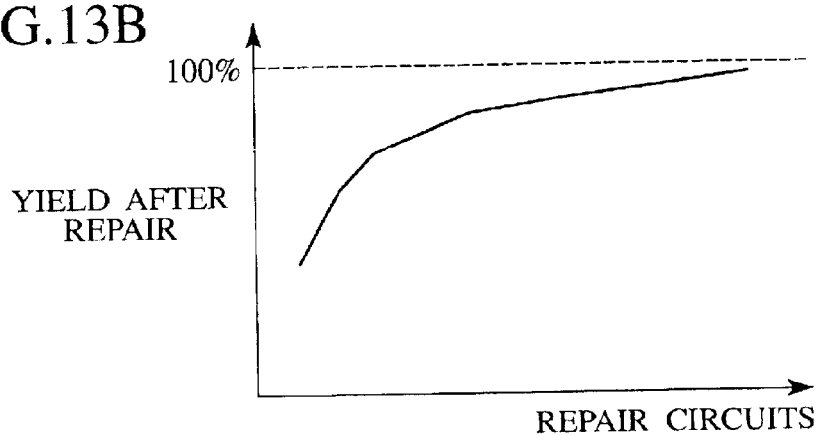
FIG. 13B is a graph showing a relationship between a yield and the number of redundant circuits.
Figure 13C:
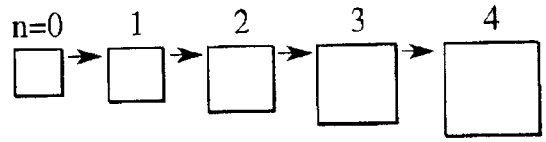
FIG. 13C shows increasing chip areas in proportion to the number of redundant circuits.
Figure 13D:
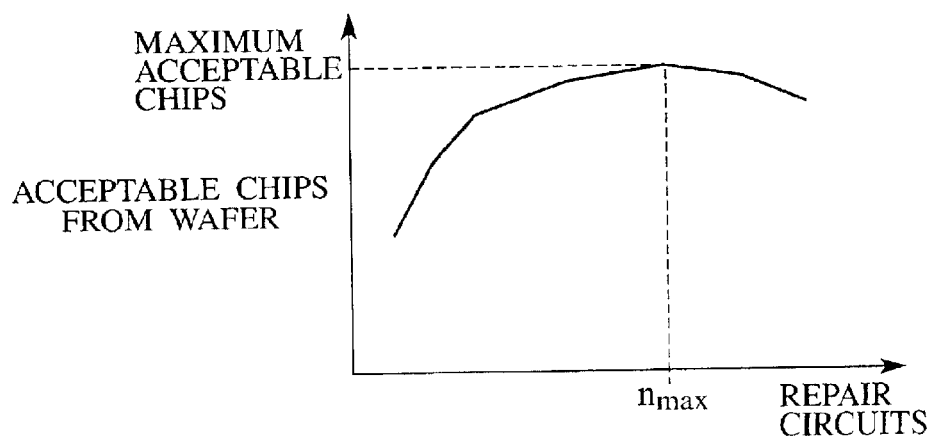
FIG. 13D is a graph showing the number of redundant circuits with respect to the number of acceptable chips producible from a wafer.

(3) Step S33 examines a relationship between the number of acceptable chips and the total number of chips producible from a wafer. As the number of redundant circuits increases, the number of acceptable chips increases and the total number of chips producible from a wafer decreases. Then, step S33 calculates the number of redundant circuits that maximizes the number of acceptable chips producible from a wafer. First, step S33 calculates a yield after repair with respect to a given number of redundant circuits. In FIG. 13A, the number of redundant circuits is set at an arrow mark. Any chip whose number of redundant circuits is greater than the set number of redundant circuits is an unacceptable chip, and any chip whose number of redundant circuits is equal to or smaller than the set number of redundant circuits is an acceptable chip. Increasing the number of redundant circuits, i.e., shifting the arrow mark in FIG. 13A toward the right increases the number of acceptable chips and decreases the number of unacceptable chips. FIG. 13B is a graph showing a yield after repair with respect to the number of redundant circuits. The "yield after repair" is the ratio of acceptable chips to total chips produced from a wafer after replacing electrical faults with the redundant circuits. In FIG. 13B, the yield after repair increases toward 100% according to an increase in the number of redundant circuits. However, an area in each chip required by the redundant circuits also increases as the number of redundant circuits increases, as shown in FIG. 13C. This results in reducing the total number of chips producible from a wafer whose area is fixed. In consideration of the yield after repair and the total number of chips producible from a wafer, the maximum number "nmax" of redundant circuits that maximizes the number of acceptable chips from a wafer is calculated as shown in FIG. 13D.

(4) Step S34 provides the yield after repair.

In this way, the fourth embodiment calculates a frequency distribution of redundant circuits necessary for relieving all electrical faults in individual chips divided from a wafer and calculates the maximum number "nmax" of redundant circuits that maximizes the number of acceptable chips producible from the wafer, thereby optimizing a yield after repair.

Although the fourth embodiment directly employs a frequency distribution of redundant circuits to determine an optimum number of redundant circuits, this does not limit the fourth embodiment. Like the first to third embodiments, the fourth embodiment may approximate a frequency distribution of redundant circuits by overlaying at least two discrete distribution functions. With these techniques, the fourth embodiment may calculate a frequency distribution of redundant circuits to estimate an improvement to be made in a manufacturing line, or a frequency distribution of redundant circuits in next-generation shrunk devices.

Fifth Embodiment

A method of managing semiconductor device manufacturing processes according to the fifth embodiment of the present invention will be explained with reference to FIG. 14. The fifth embodiment applies the clustering faults searching method of the embodiments to semiconductor device testing processes in semiconductor device manufacturing. According to the fifth embodiment, a search target is a plurality of lots in which clustering faults are searched for.

(1) Step S41 picks up one of the lots.

(2) Step S42 enters data on the numbers of electrical faults present in chips contained in the picked-up lot.

(3) Step S43 calculates a frequency distribution of the electrical faults in the individual chips.

(4) Step S44 approximates the frequency distribution of electrical faults by overlaying a Poisson distribution and a negative binomial distribution according to the expression (3), and calculates a weight WNB of the negative binomial distribution.

(5) Step S45 checks to see if all of the lots have been picked up. If step S45 is NO to indicate there is a lot to be picked up, step S41 picks up the lot and steps S42 to S44 find a negative-binomial-distribution weight WNB. If step S45 is YES to indicate that all lots have been picked up, step S46 is carried out.

Figure 15:
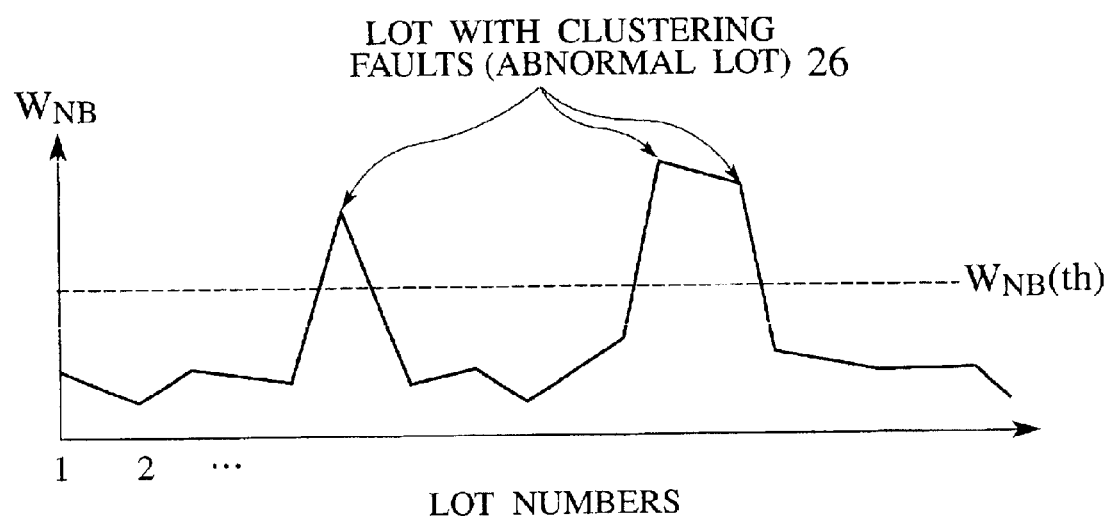
FIG. 15 is a graph showing negative binomial distribution weights (WNBs) with respect lot numbers.

(6) Step S46 displays a graph of the negative-binomial-distribution weights WNBs of the lots. FIG. 15 is an example of such a graph. The graph clearly shows abnormal lots 26 involving clustering faults. If this graph descends toward the right, it indicates that the cause of the clustering faults is being removed from manufacturing processes and that production environments are being improved. If the graph ascends toward the right, it indicates that production environments are worsening. Namely, the graph visualizes the level of production environments. The threshold negative-binomial-distribution weight WNB(th) mentioned in the first embodiment may be plotted on the graph of FIG. 15, to visually find lots involving clustering faults.

In this way, the fifth embodiment approximates a frequency distribution of electrical faults in each lot by overlaying a Poisson distribution and a negative binomial distribution, finds the weights WNBs of the negative binomial distributions of the lots, and provides a graph of the weights WNBs. The graph helps understand lots the involve clustering faults, the levels of the clustering faults, the tendency of the clustering faults, etc. Accordingly, the fifth embodiment is applicable to various testing processes in semiconductor manufacturing, to correctly manage and improve semiconductor device manufacturing processes.

Instead of the negative-binomial-distribution weights WNBs, the fifth embodiment may form a graph of other parameters related to discrete distribution functions, such as distribution function averages ($\lambda$p, $\lambda$NB) and clustering faults parameter $\alpha$. For example, a graph of Poisson distribution averages $\lambda$p tells the trend of random electrical faults. This trend is useful to manage dust in a clean room, study a clean level in a clean room, and determine the timing of filter replacement in a clean room. A graph of clustering faults parameter $\alpha$ tells the trend of clustering faults. This trend is useful to detect lots involving clustering faults of large degree and grasp the trend of clustering faults.

Sixth Embodiment

Figure 16:
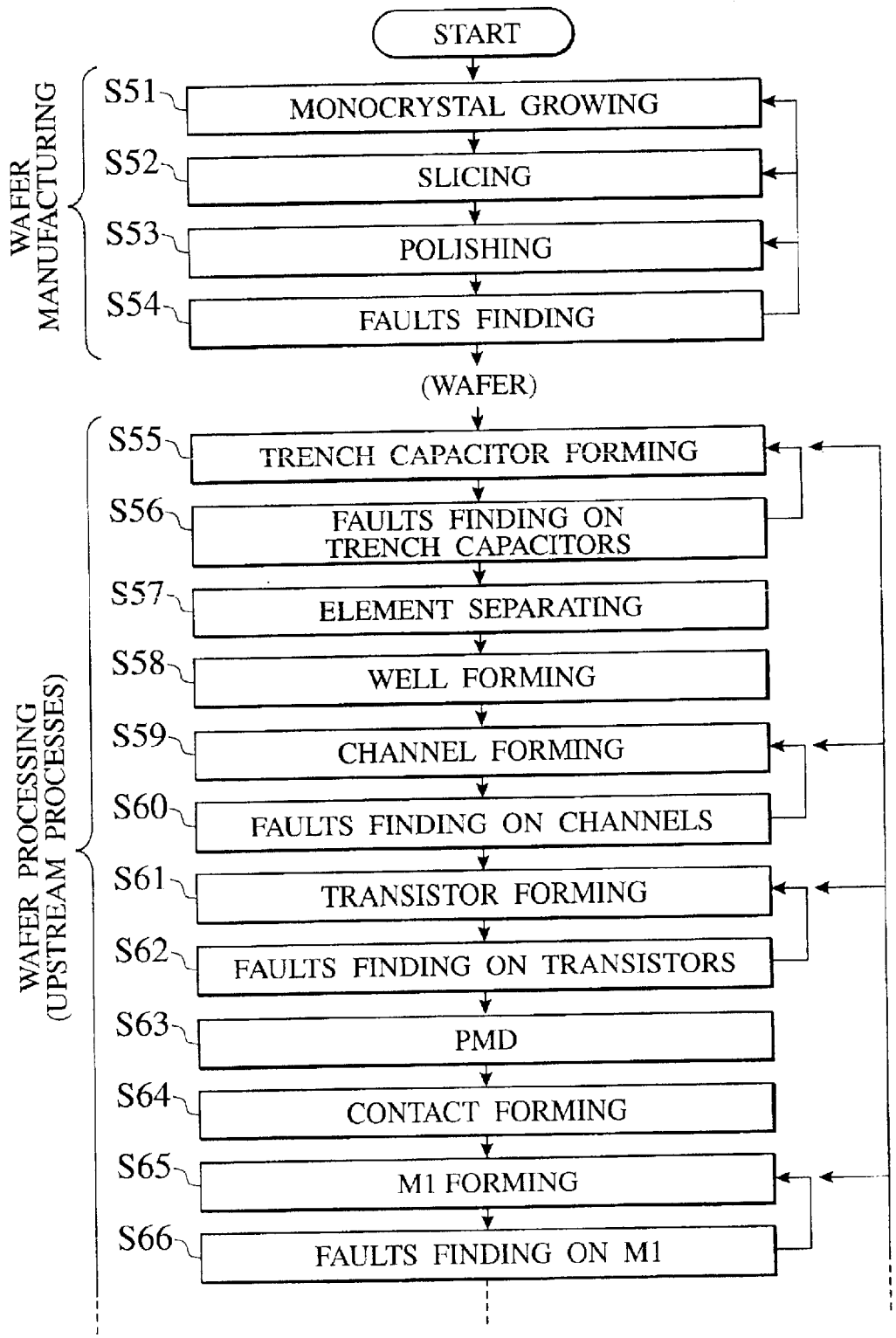
FIGS. 16 and 17 are flowcharts showing a method of manufacturing semiconductor devices according to a sixth embodiment of the present invention.
Figure 17:
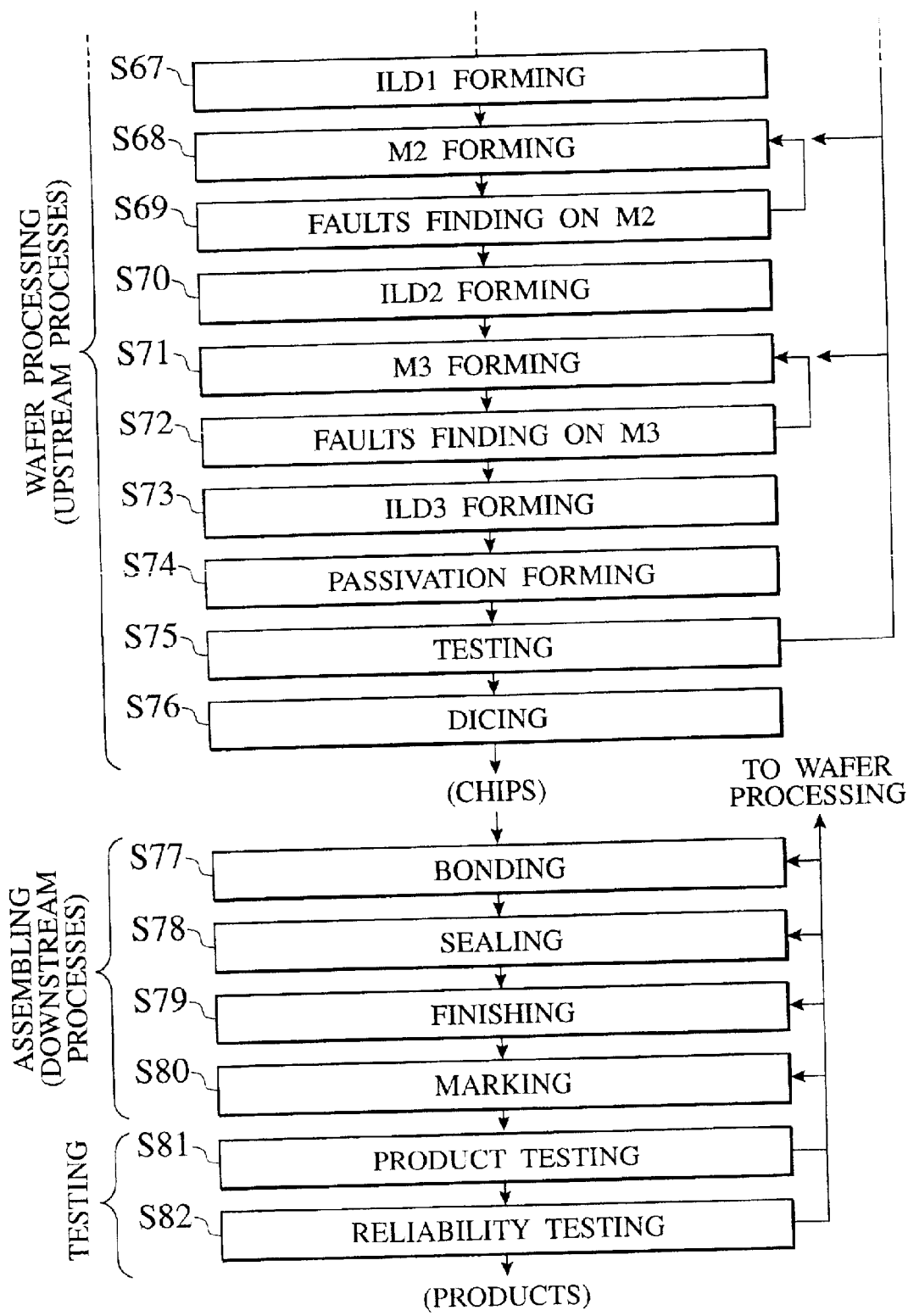

The sixth embodiment of the present invention relates to a method of managing a clean room based on the method of managing semiconductor device manufacturing processes of the fifth embodiment, and a method of manufacturing semiconductor devices involving clustering faults testing processes. The sixth embodiment will be explained in connection with mixed DRAMs with reference to FIGS. 16 to 18 in which FIGS. 16 and 17 are flowcharts showing the semiconductor device manufacturing method.

The semiconductor device manufacturing method of the sixth embodiment is largely classified into wafer manufacturing, wafer processing (upstream processes), assembling (downstream processes), and testing. Based on this classification, the method of the sixth embodiment will be explained.

(1) The wafer manufacturing will be explained. Step S51 is a monocrystal growing process that employs a CZ method or an FZ method to grow a semiconductor monocrystal ingot. Step S52 is a slicing process that slices the semiconductor monocrystal ingot into semiconductor wafers. Step S53 is a polishing process that flatly polishes the surfaces of the wafers. Step S54 is a defects finding process that employs a defect detector to find crystal defects on the wafers. In addition, step S54 employs any one of the clustering faults searching methods of the embodiments, to search for clustering crystal defects. Results provided by step S54 are fed back to steps S51 to S53, to improve the processes. Through these processes, semiconductor wafers are manufactured.

(2) The wafer processing (upstream processes) will be explained. Step S55 is a trench capacitor forming process that selectively etches each semiconductor substrate, i.e., wafer to form trenches for trench capacitors of DRAM memory cells. Step S56 is a defects finding process that employs a crystal defect detector to detect crystal defects in the trenches. In addition, step S56 employs any one of the clustering faults searching methods of the embodiments, to search for clustering crystal defects. Results provided by step S56 are fed back to step S55, to improve the trench capacitor forming process.

Step S57 is an element separating process that selectively heat-oxidizes element separation regions of each semiconductor substrate, to form a LOCOS oxide film. Step S58 is a well forming process that selectively diffuses n- and p-type impurities to each semiconductor substrate, to form n- and p-well regions of p- and n-channel transistors. Step S59 is a channel forming process that forms channel regions of the p- and n-channel transistors. Step S60 is a defects finding process that employs a defect detector to detect crystal defects in the channels and defects in a gate insulating film. In addition, step S60 employs any one of the clustering faults searching methods of the embodiments, to find clustering crystal defects and clustering gate insulation film defects. Results from step S60 are fed back to the channel forming process of step S59, to improve the process.

Step S61 is a transistor forming process that forms gate electrodes on the channels and source and drain regions with respect to the gate electrodes in a self-aligning manner. Step S62 is a faults finding process that finds defects and electrical faults on the transistors, such as crystal defects on the transistors, shape abnormalities of the gate electrodes, and diffusion abnormalities of the source and drain regions. In addition, step S62 employs any one of the clustering faults searching methods of the embodiments, to find clustering defects and electrical faults on the transistors. Results from step S62 are fed back to step S61, to improve the transistor forming process.

Step S63 is a PMD (pre-metal dielectric) forming process that deposits an insulating film on each semiconductor substrate. Step S64 is a contact forming process that selectively removes the insulating film on the source and drain regions and gate electrodes and forms contact holes. Step S65 is an M1 (metal-1) forming process that deposits a metal layer such as an aluminum layer on the insulating film and in the contact holes, patterns the metal film, and forms a first wiring layer connected to the electrode regions of the transistors. Step S66 is a faults finding process that checks the first wiring layer for defects and electrical faults including opens, shorts, shape abnormalities, and scratches. In addition, step S66 employs any one of the clustering faults searching methods of the embodiments, to find clustering defects and electrical faults in the first wiring layer. Results from step S66 are fed back to step S65, to improve the M1 forming process.

Referring to FIG. 17, step S67 is an ILD1 (interlayer dielectric-1) forming process that evenly forms a first interlayer insulating film on the first wiring layer. Step S68 is an M2 (metal-2) forming process that forms a second wiring layer like the first wiring layer. Step S69 is a faults finding process that checks the second wiring layer for defects and electrical faults including opens, shorts, shape abnormalities, and scratches. In addition, step S69 employs any one of the clustering faults searching methods of the embodiments, to find clustering defects and electrical faults in the second wiring layer. Results from step S69 are fed back to step S68, to improve the M2 forming process.

Step S70 is an ILD2 (interlayer dielectric-2) forming process that evenly forms a second interlayer insulating film like the first interlayer insulating film. Step S71 is an M3 (metal-3) forming process that forms a third wiring layer like the first wiring layer. Step S72 is a faults finding process that checks the third wiring layer for flows and electrical faults including opens, shorts, shape abnormalities, and scratches. In addition, step S72 employs any one of the clustering faults searching methods of the embodiments, to find clustering defects and electrical faults in the third wiring layer. Results from step S72 are fed back to step S71, to improve the M3 forming process. Step S73 is an ILD3 (interlayer dielectric-3) forming process that evenly forms a third interlayer insulating film like the first interlayer insulating film. Step S74 is a passivation forming process that deposits a protective film such as a silicon nitride film.

Step S75 is a testing process that sets probes on electrode pads of semiconductor chips on each wafer, to carry out a function test and detect electrical faults in the semiconductor chips. Step S75 employs any one of the clustering faults searching methods of the embodiments, to find clustering electrical faults in the semiconductor chips. A result of the clustering faults finding is fed back to steps S55, S59, S61, S65, S68, S71, etc., to improve the processes concerned. Step S76 is a dicing process that cuts semiconductor chips from each wafer. This completes the production of semiconductor chips.

(3) The assembling (downstream processes) will be explained. Step S77 is a bonding process that sets each semiconductor chip on a base board such as a lead frame and electrically connects them together with very fine wires. Step S78 is a sealing process that covers each semiconductor chip with resin to insulate the chip from external environments and protect the chip from mechanical and environmental stress. Step S79 is a finishing process that finishes the periphery of each chip by, for example, removing resin burrs. Step S80 is a marking process that prints, for example, a product number and manufacturer name on the periphery of the chip.

(4) The testing will be explained. Step S81 is a product testing process that carries out a function test on each semiconductor device product and find electrical faults in the product. In addition, step S81 employs any one of the clustering faults searching methods of the embodiments, to find clustering electrical faults. Results from step S81 are fed back to steps S77 to 80 in the assembling and steps S55, S59, S61, S65, S68, S71, etc., in the wafer processing, to improve the processes concerned. Step S82 is a reliability testing process that applies thermal or electrical stress to each semiconductor device product to carry out reliability tests including an accelerated life test. The reliability tests accelerate faulty mechanisms contained in the semiconductor devices, to surface defects and electrical faults that are undetectable in the tests during manufacturing. Any one of the clustering faults searching methods of the embodiments is employed to search the surfaced faults for clustering faults in each semiconductor device product. A result of the clustering faults search is fed back to steps S77 to 80 in the assembling and steps S55, S59, S61, S65, S68, S71, etc., in the wafer processing, to improve the processes concerned. Through these processes, the sixth embodiment manufactures reliable semiconductor devices.

Figure 18:
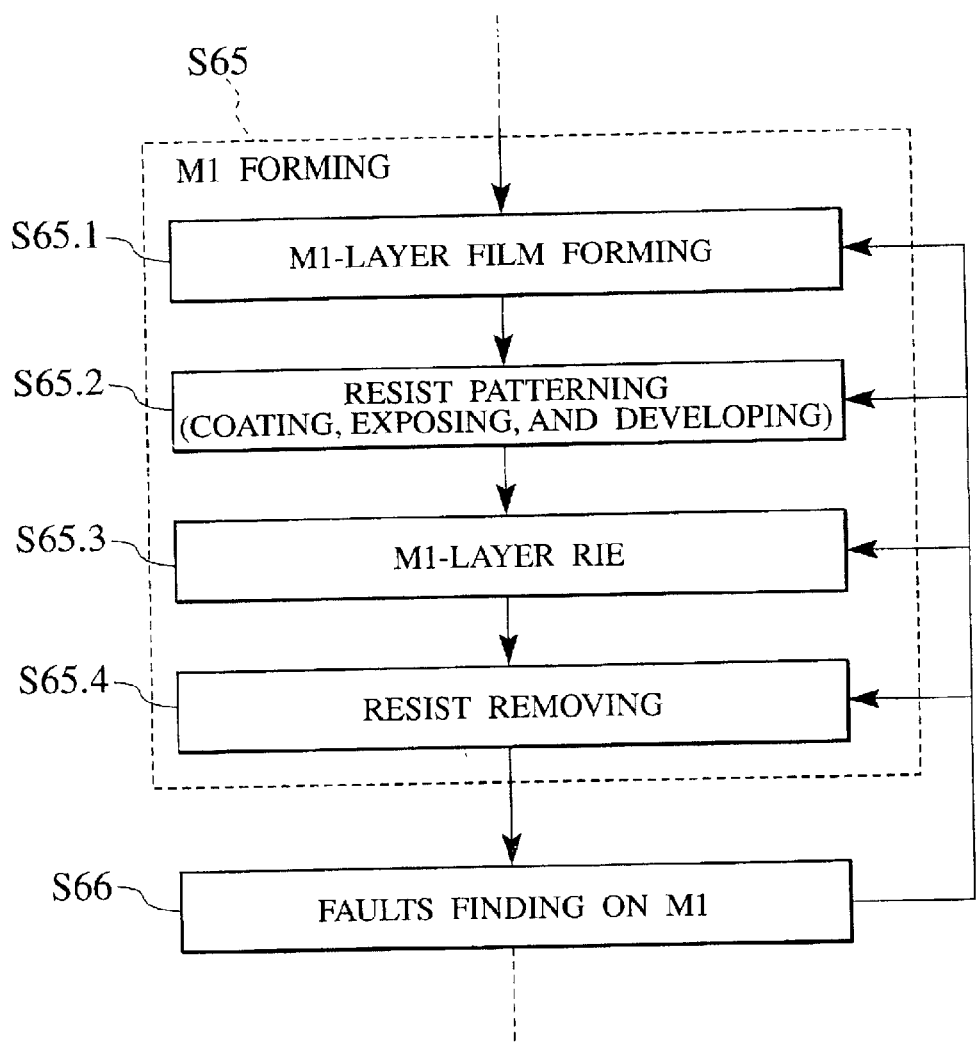
FIG. 18 is a flowchart showing the details of an M1 forming process of FIG. 16.

The M1 forming process of step S65 will be explained in detail with reference to FIG. 18. Step S65 includes four processes in FIG. 18. Step S65.1 is a film forming process that evenly deposits a metal film by, for example, spattering. Step S65.2 is a resist patterning process that uniformly forms (coats) a resist film with a spinner, exposes the resist film to light through a mask, develops the resist film with a developing liquid, and forms a resist pattern having the same shape as the first wiring layer. Step S65.3 is an RIE process that uses the resist pattern as a mask and selectively removes the metal film by RIE. Step S65.4 is a resist removing process that removes the resist pattern.

After these four processes, step S66 carries out the faults finding process on the metal 1 (M1). Clustering faults, if found in step S66, are fed back to the four processes of the M1 forming process, to improve the processes. If there are many wiring open faults, it is presumed that the cause of the faults will be dust on a wafer present before the M1 forming process. If there are many wiring short faults at the same location in each shot, it is presumed that the cause of the faults will be an abnormal shape of the mask used in the resist patterning process. Although the details of test result feedback have been explained based on the M1 forming process in FIG. 18, the other manufacturing processes of FIGS. 16 and 17 also involve subsidiary processes to which test results are fed back.

In this way, the sixth embodiment carries out various tests during manufacturing to find defects and electrical faults and searches the found defects and electrical faults for clustering faults. The sixth embodiment is capable of finding clustering defects and electrical faults in early stages in manufacturing and identifying processes that cause the clustering faults. The sixth embodiment is effective to improve semiconductor device manufacturing processes and raise yield.

Although the sixth embodiment carries out the clustering faults searching method of the embodiments in major testing/inspecting processes in semiconductor device manufacturing, it is not always necessary to achieve the clustering faults searching method in every testing/inspecting process in semiconductor device manufacturing. The clustering faults searching method may be carried out in testing/inspecting processes selected by the user, to properly achieve the effect of the sixth embodiment. For example, the clustering faults searching method may take place only in testing/inspecting processes in a clean room, to properly manage the clean room and improve processes achieved in the clean room.

Seventh Embodiment

Recent fine processing technologies involve complicated element structures and multiple wiring layers that need many processes and equipment to make. Increased numbers of processes and equipment increase a probability of imperfect entities (electrical faults, defects, redundant circuits, etc.,) to decrease yield. It is difficult to identify a process or equipment that is the cause of the imperfect entities. An important matter is how to improve the productivity of manufacturing lines in a semiconductor device factory. More important is how to produce acceptable wafers and chips as many as possible. If equipment in a given process has a problem, wafers processed by the equipment in the process will involve many faults to drop yield. Wafers not processed by the equipment in the process will show high yield. It is important to identify the process and equipment that drop yield and correct them.

The seventh embodiment of the present invention provides a method and an apparatus that use the negative-binomial-distribution weight WNB of the expression (3) to efficiently identify any problematic process or equipment that drops yield.

Figure 19:
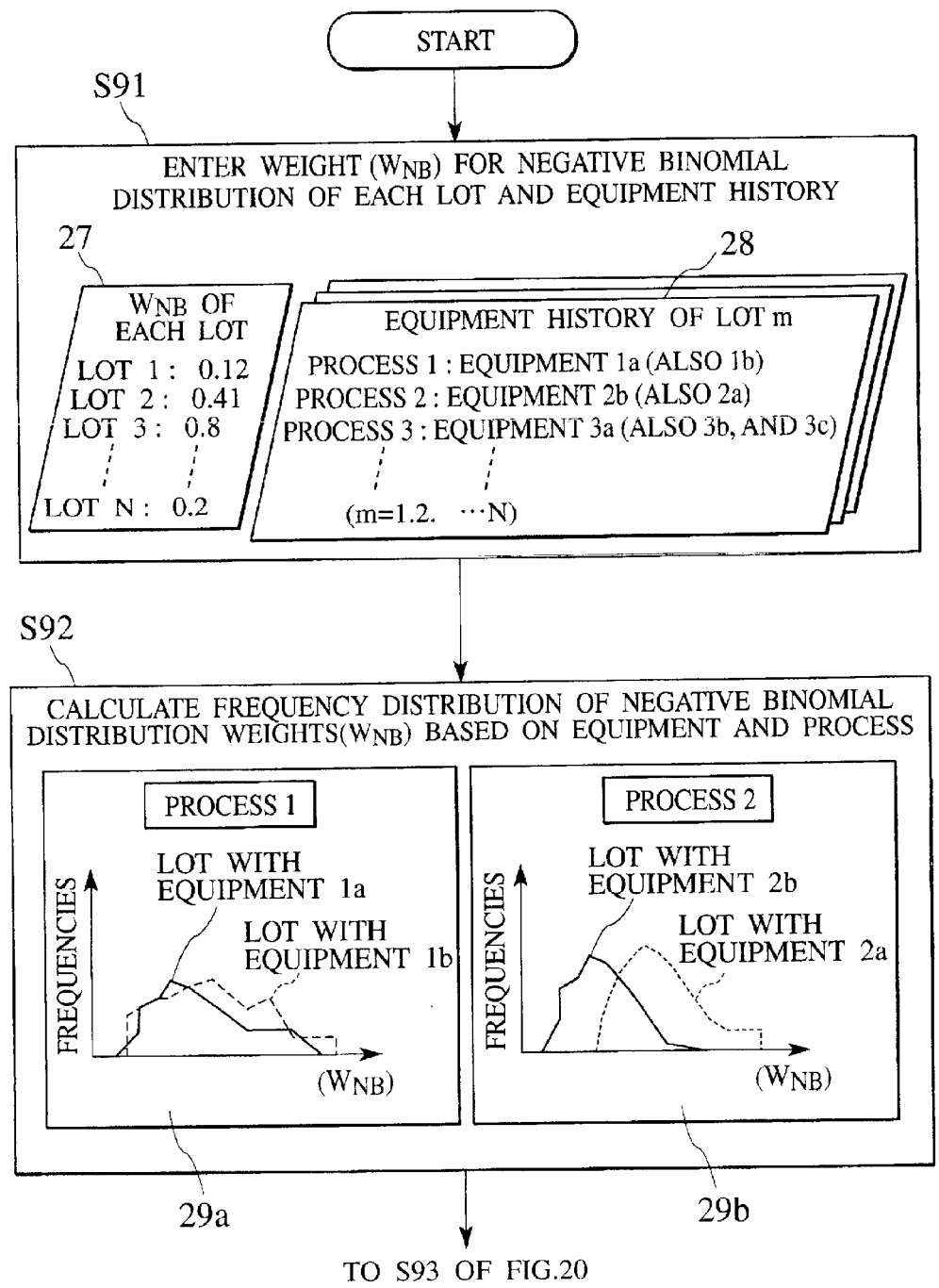
FIGS. 19 and 20 are flowcharts showing a method of extracting problematic processes and equipment according to a seventh embodiment of the present invention.
Figure 20:
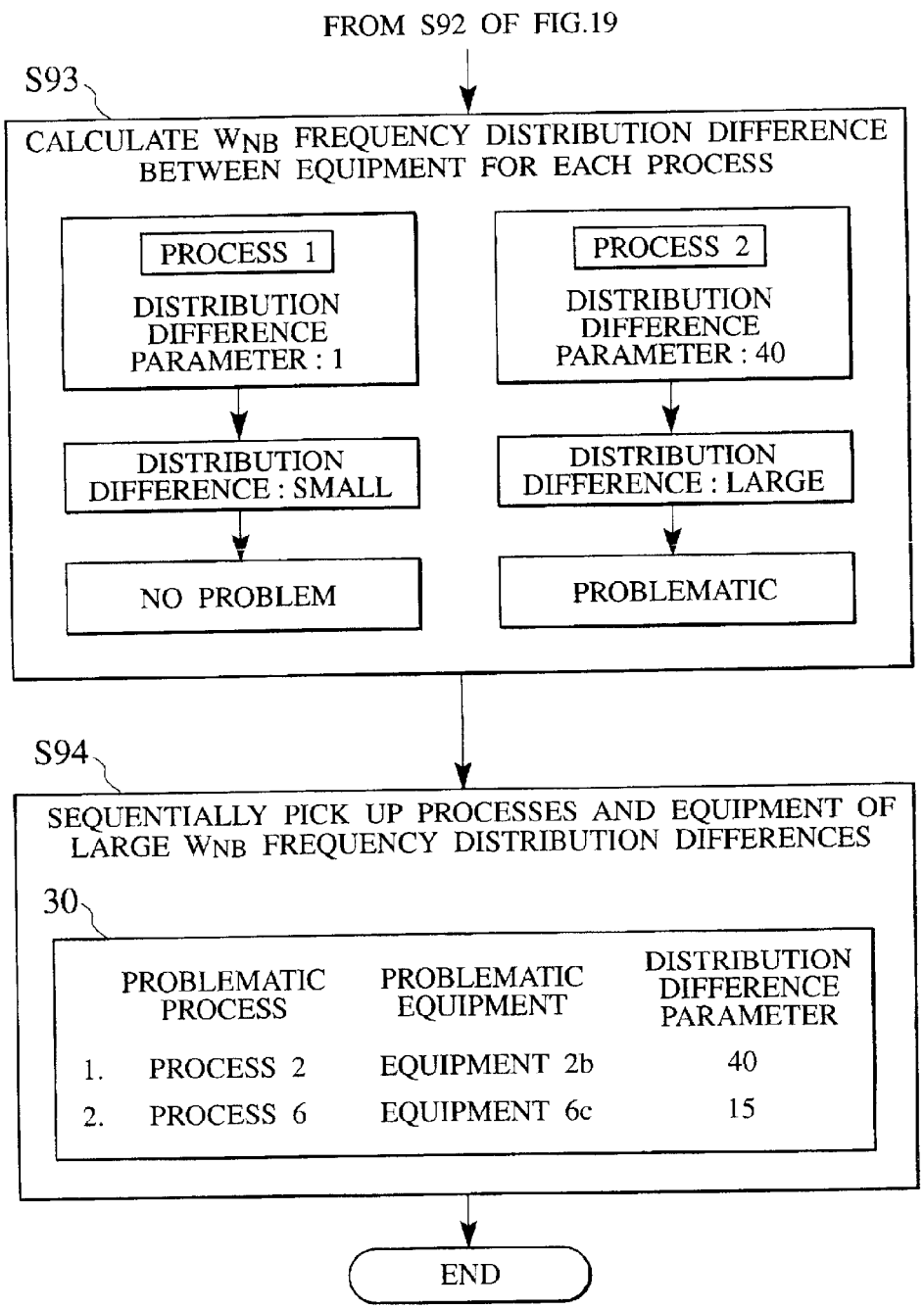

FIGS. 19 and 20 are flowcharts showing the method of identifying problematic processes and equipment according to the seventh embodiment. The flowchart of FIG. 19 continues to FIG. 20, to complete the flow of the method. FIGS. 19 and 20 show only the basics of the method of identifying problematic processes and equipment according to negative-binomial-distribution weights WNBs. The method of calculating the weight WNB of a negative binomial distribution explained with reference to FIGS. 1 and 14 is not shown in FIGS. 19 and 20. According to the seventh embodiment, electrical faults serve as imperfect entities, a lot as a search target, and chips as unit cells. In this embodiment, there are a plurality of search targets, i.e., lots.

Figure 14:
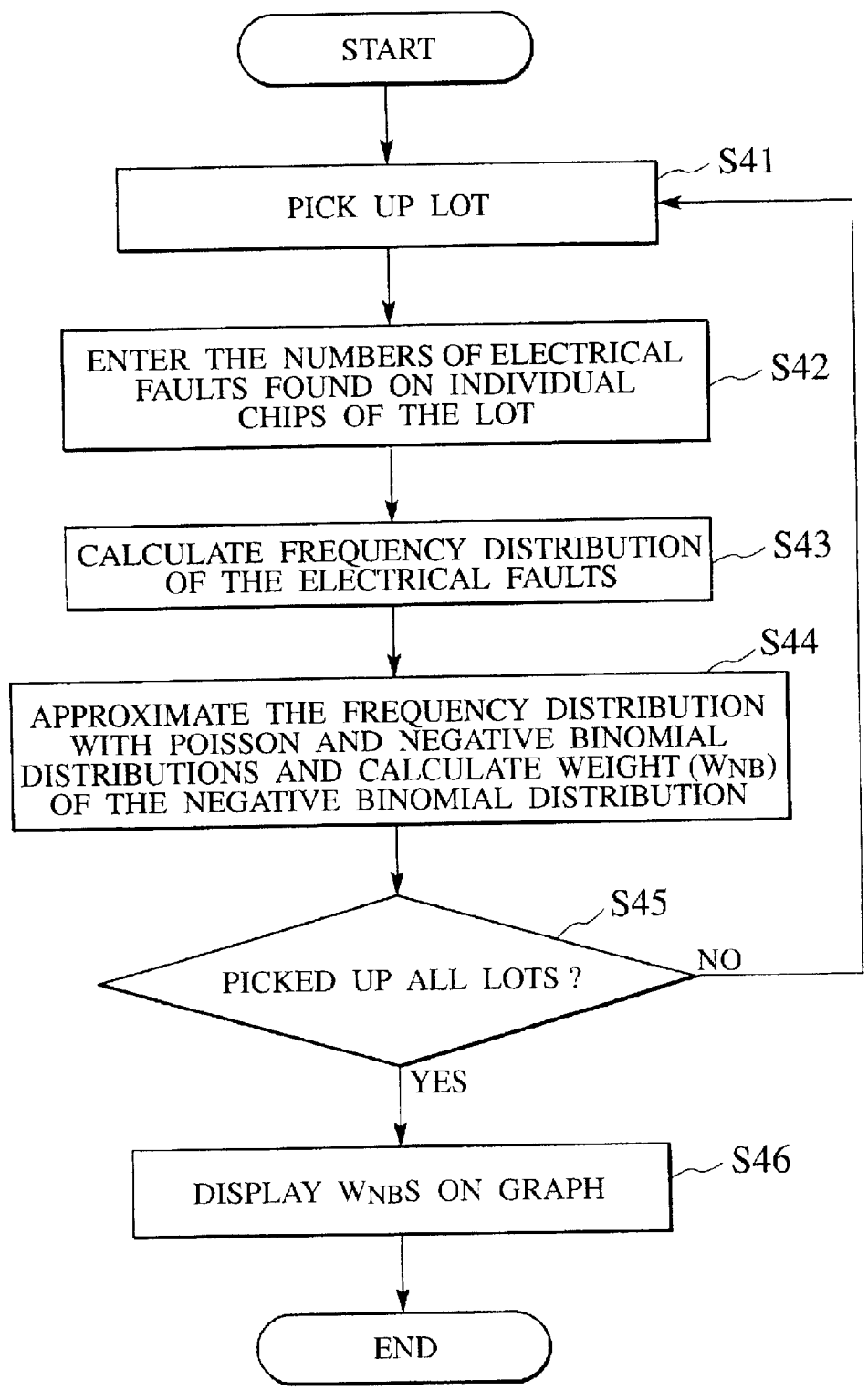
FIG. 14 is a flowchart showing a method of managing processes and a clean room according to a fifth embodiment of the present invention.

(1) Like the fifth embodiment of FIG. 14, the weight WNB of a negative binomial distribution is calculated for each lot. Namely, step S41 of FIG. 14 picks up one of the lots, step S42 finds the numbers of electrical faults present in chips in the lot, and step S43 calculates a frequency distribution of the electrical faults. Step S44 approximates the frequency distribution by overlaying a Poisson distribution and a negative binomial distribution and calculates a weight WNB of the negative binomial distribution according to the expression (3). Step S45 repeats steps S41 to S44, and step S46 obtains the weights WNBs of the negative binomial distributions of all lots.

(2) Referring to FIG. 19, step S91 enters a list 27 of the weights WNBs of the negative binomial distributions of all lots and an equipment history 28 of each lot. The lots on the list 27 are search targets and may be all lots from all processes and equipment including possible problematic processes and equipment, or may be sampled lots. According to the embodiment, the list 27 includes "N" lots, i.e., "N" weights WNBs.

The equipment history 28 of a given lot shows equipment used to process the lot. For example, a lot m (the "m"th lot) was processed by equipment $1a$ in process 1, by equipment $2b$ in process 2, by equipment $3a$ in process 3, and the like. Step S91 enters such history for each of the lots 1 to N serving as the search targets. The equipment history 28 includes all related equipment for each process. For example, the equipment history 28 of the lot m indicates that chips in the lot m are processed not only by equipment $1a$ but also by equipment $1b$ in the process 1, not only by equipment $2b$ but also by equipment $2a$ in the process 2, not only by the equipment $3a$ but also by equipment $3b$ or $3c$, and the like. The equipment history 28 may be standard process flow data that shows relationships between lots and processes and equipment that process the lots.

(3) Step S92 uses the list 27 and equipment history 28 and calculates a frequency distribution of the negative-binomial-distribution weights WNBs for each process and for each equipment piece. A graph $29a$ in step S92 shows a frequency distribution of the weights WNBs of the lots processed by the equipment $1a$ in the process 1, and a frequency distribution of the weights WNBs of the lots processed by the equipment $1b$ in the process 1. A graph $29b$ in step S92 shows a frequency distribution of the weights WNBs of the lots processed by the equipment $2a$ in the process 2, and a frequency distribution of the weights WNBs of the lots processed by the equipment $2b$ in the process 2. In each graph, an abscissa represents the WNBs and an ordinate represents the numbers (frequencies) of lots.

The calculation of a frequency distribution of weights WNBs for each equipment piece will be explained in connection with the process 1. According to the equipment history 28, target lots are classified into ones processed by the equipment $1a$ and ones processed by the equipment $1b$. According to the weight list 27, a frequency distribution of the weights WNBs of the lots processed by the equipment $1a$ is plotted on the graph $29a$. Similarly, a frequency distribution of the weights WNBs of the lots processed by the equipment $1b$ is plotted on the graph $29a$. The same operations are carried out for the process 2 and the other processes, to classify lots into equipment groups and plot frequency distributions of the weights WNBs on graphs.

In FIG. 19, the graphs $29a$ and $29b$ show a small difference between the weight frequency distributions of the equipment $1a$ and $1b$ and a large difference between the weight frequency distributions of the equipment $2a$ and $2b$. In this way, even the same process shows a difference or no difference between the weight frequency distributions of different pieces of equipment. As explained in the first embodiment, the weight WNB of a negative binomial distribution is indicative of the degree of clustering faults in a wafer, and such clustering faults are caused by a specific reason. A difference between the weight frequency distributions of different pieces of equipment indicates that the degree of clustering faults in a lot is dependent on the equipment that processed the lot.

(4) Step S93 of FIG. 20 calculates a difference between the negative binomial distribution weights WNBs of equipment pieces in each process. Namely, for each of the graphs $29a$ and $29b$ of FIG. 19, step S93 quantitatively calculates the difference between the weights WNBs, to determine whether or not there is a problem.

More precisely, if each frequency distribution of negative-binomial-distribution weights WNBs is a normal distribution, or is approximated by a normal distribution, a t-test is employed to find a difference between weight frequency distributions and the degree of the difference (the number of significant differences). If each frequency distribution is not a normal distribution, or is not approximated by a normal distribution, the lots concerned are divided into groups according to characteristic quantities. Then, each of the groups is analyzed to find out processes and equipment related to lots in each group. For example, if there is a group involving a high degree of clustering faults, the processes and equipment related to lots contained in the group are clarified. This is carried out by an $x^2$-test that compares $x^2$ values with each other to extract problematic processes and equipment. Here, the $x^2$ values indicate deviations from a normal value involving no problems.

In step S93 of FIG. 20, a parameter indicating the difference between the weight frequency distributions of the process 1 is 1. In this case, it is determined that the difference is small, and therefore, the process 1 is not problematic. On the other hand, a parameter indicating the difference between the weight frequency distributions of the process 2 is 40. In this case, it is determined that the difference is large, and therefore, the process 2 is problematic. The determination of a problematic process may be made like the first embodiment of determining clustering faults. Namely, instead of the threshold negative-binomial-distribution weight WNB(th) of step S401 of FIG. 3, the seventh embodiment sets a threshold for a parameter indicating a weight frequency distribution difference, and according to comparison between this threshold and a weight frequency distribution difference parameter of each process, automatically determines whether or not the process is problematic.

(5) Step S94 sequentially picks up, as problematic processes and equipment, the processes and equipment having large weight frequency distribution differences. For example, step S94 of FIG. 20 picks up the process 2 and equipment 2b having a largest weight frequency distribution difference of 40, and the process 6 and equipment 6c having a second largest weight frequency distribution difference of 15, and the like. The picked-up processes and equipment form a list 30 shown in step S94. The seventh embodiment checks the picked-up problematic processes and equipment sequentially from the top of the list 30, to see if the process or equipment causes faults. This results in quickly identifying processes and equipment that drop yield. The threshold set for the parameter indicating a weight frequency distribution difference may be used to issue an alarm to the user whenever a problematic process or equipment that exceeds the threshold is found. Then, the user may take a quick action against the abnormality in manufacturing processes.

Figure 21:
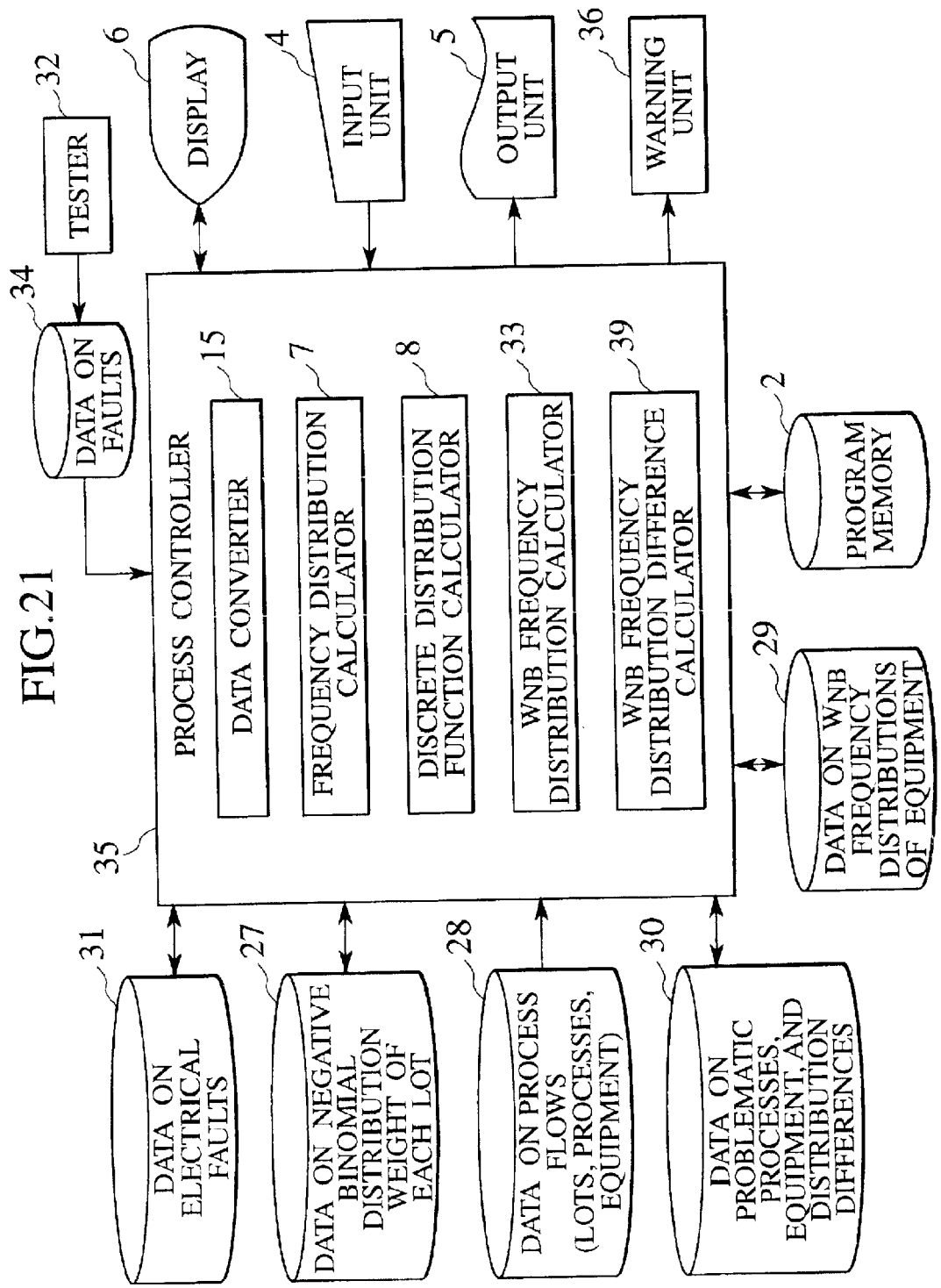
FIG. 21 is a block diagram showing an apparatus for extracting the method of the seventh embodiment.

FIG. 21 is a block diagram showing an apparatus for identifying a problematic process and equipment according to the seventh embodiment of the present invention. The apparatus achieves the method of identifying problematic processes and equipment explained with reference to FIGS. 19 and 20

In FIG. 21, the apparatus includes a tester (electric fault detector) 32, a process controller 35, a program memory 2, a data memory, an input unit 4 to enter data on electrical faults present in a wafer, an output unit 5, a display 6 to display distribution shapes, and an alarm unit 36. According to the seventh embodiment, the data memory is mainly made of a part to store data 31 on electrical faults, a part to store data 27 on negative-binomial-distribution weights WNBs lot by lot, a part to store process data (equipment history) 28, a part to store data 29 on a frequency distribution of weights WNBs equipment by equipment, a part to store data 30 on problematic processes and equipment and weight frequency distribution differences, and a part to store data 34 on faults.

The tester 32 corresponds to the electrical fault detector 16 of the third embodiment of FIG. 10. The tester 32 employs an electrical or optical technique to detect electrical faults in a wafer, and provides the coordinates of the detected electrical faults on the wafer. Instead of the tester 32, it is possible to employ an electron beam tester (EB tester), an emission microscope (EMS), or an electronic microscope.

The process controller 35 includes functional units to pick up problematic processes and equipment. The functional units include a data converter 15 to convert the faults data 34 from the tester 32 into data usable to form a frequency distribution of electrical faults, a frequency distribution calculator 7 to calculate a frequency distribution of electrical faults in chips, a discrete distribution function calculator 8 to approximate a frequency distribution of electrical faults by overlaying at least two discrete distribution functions, a weight frequency distribution calculator 33 to calculate a distribution of negative-binomial-distribution weights WNBs that approximate clustering faults, and a weight frequency distribution difference calculator 39 to calculate a difference between frequency distributions of negative-binomial-distribution weights of different equipment pieces.

The data converter 15 converts the faults data 34 provided by the tester 32 into faults data 31 in a format appropriate to calculate a frequency distribution of electrical faults. The data 34 from the tester 32 include the coordinates of electrical faults on a wafer. The data converter 15 converts these coordinates into the number of electrical faults in individual chips divided from the wafer. The data converter 15 is the same as that of the third embodiment of FIG. 10, and therefore, the details thereof will be omitted.

The frequency distribution calculator 7 uses the data 31 on the numbers of electrical faults to calculate a frequency distribution of electrical faults in chips. The discrete distribution function calculator 8 approximates a frequency distribution of electrical faults by overlaying a Poisson distribution and a negative binomial distribution, and calculates the weight WNB of the negative binomial distribution according to the expression (3). The calculated negative-binomial-distribution weight WNB is stored as part of the negative-binomial-distribution weight data 27 that is prepared lot by lot as explained in step S91 of FIG. 19. The frequency distribution calculator 7 and discrete distribution function calculator 8 are the same as those of the first embodiment of FIG. 2, and therefore, the details thereof are omitted.

The weight frequency distribution calculator 33 uses the data 27 on weights WNB of each lot and the process flow data 28 showing relationships between processes and equipment and calculates a frequency distribution of the negative-binomial-distribution weights WNBs lot by lot. The weight frequency distribution calculator 33 also uses the process flow data 28 of each lot, to calculate a frequency distribution of negative-binomial-distribution weights WNBs of each process and equipment. More precisely, the weight frequency distribution calculator 33 prepares the graphs 29a and 29b of FIG. 19 representing the weight frequency distributions of individual processes and individual equipment pieces. The calculated weight frequency distribution of each equipment piece is stored as the weight frequency distribution data 29.

The weight frequency distribution difference calculator 39 is a functional unit to calculate, for each process, a difference between the frequency distributions of negative-binomial-distribution weights WNBs of different equipment pieces that processed chips in the process. Namely, the calculator 39 quantitatively finds a difference between the weight frequency distributions of different equipment pieces as shown in the graphs 29a and 29b of FIG. 19. The calculator 39 includes a normal distribution test unit, a t-test unit to find a difference between frequency distributions according to a t-test, and an $x^2$-test unit carrying out an $x^2$-test to compare $x^2$ values representing problem degrees.

(1) The normal distribution test unit functions to determine whether or not a frequency distribution of negative-binomial-distribution weights WNBs of each equipment piece is a normal distribution, or is approximated with a normal distribution.

(2) If the weight frequency distribution of each equipment piece is a normal distribution or is approximated by a normal distribution, the t-test unit functions to determine whether or not there is a difference between the normal distributions of equipment pieces and calculate the difference (significant difference level).

(3) If the weight frequency distribution of each equipment piece is not a normal distribution or is not approximated by a normal distribution, the $x^2$-test unit functions to divide a target lot into groups according to characteristic quantities and analyzes the groups to clarify processes and equipment involved in each group. More precisely, the $x^2$-test unit identifies processes and equipment contained in groups that involve clustering faults of large degree. The $x^2$-test unit carries out its function by comparing $x^2$ values (representing deviations from a reference value) with each other.

The calculated parameter representing the weight frequency distribution difference is stored as the problematic processes and equipment data 30.

The program memory 2, input unit 4, and output unit 5 are the same as those of the first embodiment of FIG. 2, and therefore, the details thereof are omitted. The display 6 displays the frequency distributions of electrical faults calculated by the frequency distribution calculator 7, the discrete distribution functions provided by the discrete distribution function calculator 8, and the weight frequency distributions calculated by the weight frequency distribution calculator 33.

The alarm unit 36 is a functional unit to issue an alarm to managing personnel of the presence of problematic processes and equipment. For example, a red lamp or an alarm installed at the top of equipment along a manufacturing line is turned on when problematic equipment is found according to a distribution difference exceeding a threshold. When turned on, the red lamp or alarm directly warns managing personnel on the manufacturing line of the abnormal equipment. The data 30 concerning problematic processes and equipment and distribution differences may be displayed on a display, to inform managing personnel at a remote location of the problematic processes and equipment.

The method of identifying problematic processes and equipment according to the embodiment is expressible as a series of operations or procedures connected in time series. Accordingly, the method is expressible as a computer program to specify functions executed by processors, etc., in a computer system. The computer program may be stored in a storage medium to be read by a computer. The program in the storage medium is read by a computer, which executes the method of the seventh embodiment described in the program. The storage medium may be used as the program memory 2 of FIG. 21. The program in the storage medium may be transferred into the program memory 2, so that the process controller 35 may execute operations according to the program.

The computer system 90 of FIG. 5 may be employed to realize the apparatus of identifying problematic processes and equipment according to the seventh embodiment. The apparatus 90 reads the computer program based on the seventh embodiment from a storage medium and achieves the identification of problematic processes and equipment of the seventh embodiment according to the procedures described in the program. The apparatus 90 according to the seventh embodiment is connected to the tester 32 instead of the electric fault detector 16. The tester 32 functions to observe wafers, detect electrical faults therein, and receive/transmit the coordinates of the detected electrical faults. These functions of the tester 32 are controlled by the computer system.

As explained above, the seventh embodiment uses negative-binomial-distribution weights WNBs to identify processes and equipment that deteriorate yield. This technique is quite different from a prior art that obtains a yield of each lot, calculates a frequency distribution of yields process by process and equipment by equipment, finds a difference between the yield frequency distributions of different equipment pieces, and identifies problematic processes and equipment. Instead of the yield of each lot of the prior art, the seventh embodiment obtains the negative-binomial-distribution weights WNBs of each lot as shown in the graphs 29a and 29b of step S92 of FIG. 19.

The prior art that employs yield may identify processes and equipment that greatly affect yield. The prior art however, is incapable of identifying processes and equipment that in combination cause a yield deterioration. In particular, a memory device having redundant circuits repairs defective memory cells with the redundant circuits, and such repaired cells are screened when estimating yield. Then, it is hard for the prior art to correctly evaluate electrical faults caused during manufacturing processes.

The method of identifying problematic processes and equipment of the seventh embodiment is capable of correctly identifying processes and equipment that cause imperfect entities that deteriorate yield. The seventh embodiment carries out the problem identifying operation in a short time without labor and surely identifies problematic processes and equipment. Even if electrical faults (imperfect entities) are caused by a combination of processes and equipment, the seventh embodiment correctly identifies the processes and equipment that caused the faults. For example, the seventh embodiment correctly identifies a realignment in a lithography system, or an incompatibility between a lithography system and an etching system by analyzing not only equipment in a given process but also a combination of processes and equipment in a given process.

Figure 22:
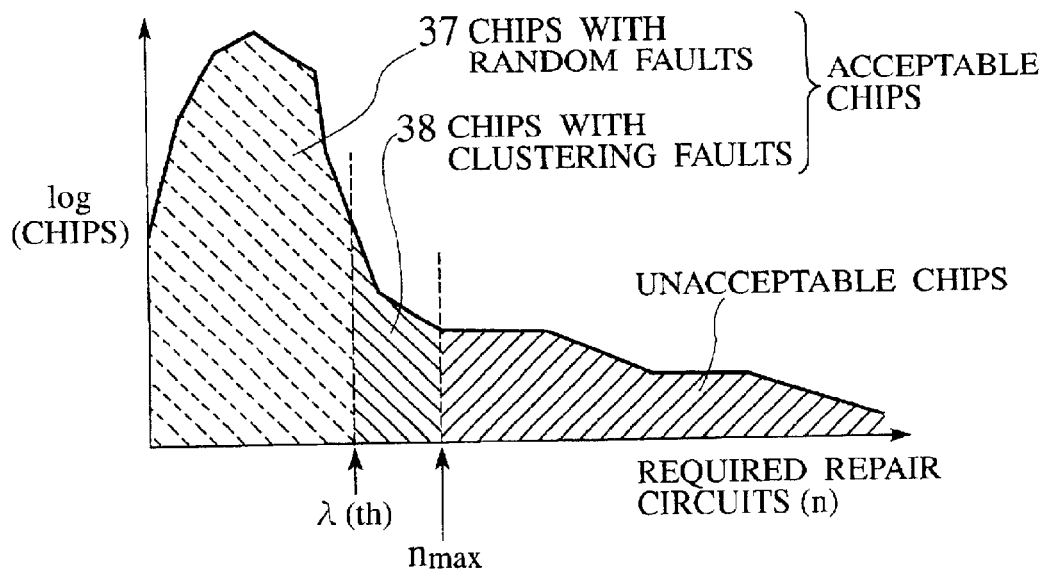
FIG. 22 is a graph showing a frequency distribution of redundant circuits and clustering faults chips (38) whose number "n" is in the range of "$\lambda th<n<nmax$" where $\lambda th$ is a clustering faults threshold and nmax is the number of redundant circuits to maximize the number of acceptable chips producible from a wafer.

In the case of a memory device, imperfect entities may be redundant circuits required to repair electrical faults. In this case, the seventh embodiment is capable of detecting defective memory cells replaced with the redundant circuits. FIG. 22 is a graph showing a frequency distribution of redundant circuits. As explained in the fourth embodiment, the number "nmax" of redundant circuits maximizes acceptable chips producible from a wafer. Any chip whose number of necessary redundant circuits is greater than "nmax" is an unacceptable chip, and any chip whose number of necessary redundant circuits is smaller than "nmax" is an acceptable chip. As explained in the second embodiment, a clustering faults threshold $\lambda$th is set according to the number of redundant circuits that satisfies the expression (7). The clustering faults threshold $\lambda$th is used to separate chips 38 involving clustering faults from chips 37 involving random faults. By employing negative-binomial-distribution weights WNBs instead of yields, the seventh embodiment is capable of considering chips 38 (FIG. 22) involving clustering faults "n" in the range of $\lambda$th<n<nmax.

The seventh embodiment may prepare a frequency distribution of imperfect entities for each layer (for example, an active area layer, a gate layer, a first wiring layer, and a second wiring layer), to more correctly identify processes and equipment that affect yield. This is because specifying a layer leads to identifying processes and equipment specific to the layer. This technique reduces the number of search targets such as lots and performs a precision analysis of faults or redundant circuits in a short time.

Although the seventh embodiment employs lots as search targets and chips as unit cells, this does not limit the seventh embodiment. According to the seventh embodiment, the search targets may be wafers, and the unit cells may be blocks, groups, or shot areas. According to the seventh embodiment, the imperfect entities are electrical faults. This does not limit the seventh embodiment. According to the seventh embodiment, the imperfect entities may be crystal defects, redundant circuits to be replaced with electrical faults, etc. If the imperfect entities are crystal defects, the tester 32 of FIG. 21 will be replaced with a defect observing unit.

The discrete distribution function parameters used by the seventh embodiment are negative-binomial-distribution weights WNBs. This does not limit the seventh embodiment. According to the seventh embodiment, the discrete distribution function parameters may be distribution function average values ($\lambda$p, $\lambda$NB) or clustering faults parameter $\alpha$. For example, a Poisson distribution average value $\lambda$p tells the trend of the density of random electrical faults. This is effective to find problematic equipment not only from manufacturing equipment but also from environmental equipment such as a dust control system in a clean room. In this case, the seventh embodiment is effective to examine clean level in a clean room and determine the replacement timing of filters in the clean room.

Eighth Embodiment

As explained at the start of the seventh embodiment, an important matter to solve is how to improve the productivity of manufacturing lines in a semiconductor factory. In this regard, it is important to improve the yield of wafers and chips.

The fifth and sixth embodiments apply the clustering faults searching method of the embodiments to various testing/inspecting processes in semiconductor device manufacturing to manage processes and equipment. Namely, the fifth and sixth embodiments provide the process managing method, clean room managing method, and semiconductor device manufacturing method.

Clustering faults found in a testing/inspecting process in semiconductor device manufacturing are useful to estimate yield at the time of testing/inspecting, as well as a final yield based on the estimated yield at the time of testing/inspecting. At each testing/inspecting process, it is possible to estimate manufacturing cost that occurs if the tested wafer or lot is scrapped and manufacturing cost that occurs if the tested wafer or lot is continuously processed. Then, the costs of the both cases are compared with each other to determine whether or not the tested wafer or lot must be scrapped at the time of testing/inspecting. To make this determination, customer's requirements must also be considered.

Figure 23:
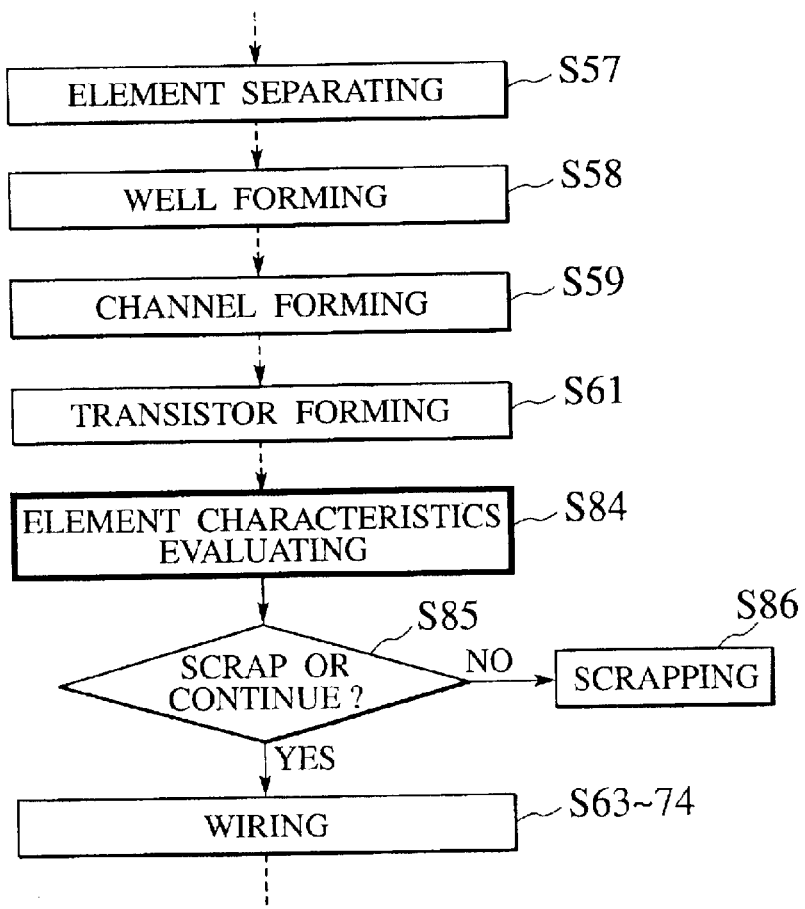
FIG. 23 is a flowchart partly showing the wafer processing (upstream processes) of FIG. 16 corresponding to a method of determining whether or not a search target must be scrapped according to an eighth embodiment of the present invention.

The eighth embodiment of the present invention provides a method of determining whether or not a search target such as a wafer and a lot must be scrapped. This method employs data on clustering faults found in various testing/inspecting processes in semiconductor device manufacturing. FIG. 23 is a flowchart showing the method according to the eighth embodiment including fundamental steps of the wafer processing (upstream processes) of FIG. 16. The eighth embodiment employs, as an example, data on clustering faults found by the testing process carried out after the transistor forming process and before the wiring process.

(1) Step S57 of FIG. 23 carries out an element separating process that forms element separating regions to isolate semiconductor element forming regions from one another on a wafer produced through a wafer manufacturing process. Step S58 carries out a well forming process that forms well regions depending on the types (p and n types) of semiconductor elements (transistors) to be formed in the element forming regions.

Step S59 carries out a channel forming process that forms channel regions by diffusing impurities of specified concentration into regions where MOS transistor channels are formed. Step S61 carries out a transistor forming process that forms a gate insulating film and gate electrodes on the channel regions, and source and drain diffusion regions in contact with the gate electrodes. This completes the formation of transistors on the wafer.

(2) Step S84 carries out an element characteristics evaluating process that evaluates the characteristics of the transistors and searches for electrical faults in the wafer. This process determines whether or not the transistors are capable of providing required functions and performance. The transistors that are incapable of providing the required functions or performance are picked up as defective transistors. More precisely, the transistors are tested for their switching speeds, gate threshold voltages, the resistance values of electrode regions such as source, drain, gate, and channel regions, and ON resistance values between sources and drains. These characteristics are tested if they satisfy required values or if they fall in marginal ranges. The transistors may also be tested for electrode-to-electrode shorts, gate insulating film faults such as pinholes, abnormal electrode patterns, crystal defects in the channel regions, p-n junction breaks between electrode regions, and other physical faults. In addition to the electrical and physical faults, the transistors may be tested for chemical contamination by alkaline metal such as Na and K and heavy metal ions such as Fe, Cu, and Ni ions.

Results of the evaluation are compiled into data that indicate, for each fault, the type of the fault, the coordinates of the fault on the wafer, etc., like the third embodiment. These pieces of data are converted by a converter such as the data converter 15 of FIGS. 10 and 21 into data necessary for calculating a frequency distribution of the faults. Namely, the coordinates of faults are converted into the numbers of faults on individual chips divided from the wafer and the coordinates of the chips on the wafer.

(3) Step S200 of the first embodiment of FIG. 3 is employed to calculate a frequency distribution of faults in the individual chips according to the converted data. Step S300 of the first embodiment is employed to approximate the frequency distribution by overlaying a Poisson distribution and a negative binomial distribution.

By using the parameters Wp, $\lambda$p, WNB, $\lambda$NB, and $\alpha$ of the expression (3) concerning with the Poisson distribution and negative binomial distribution, a yield after repair is calculated. More precisely, the frequency distribution of faults is used to estimate a probability of faults in a repair unit of not exceeding the number of redundant circuits contained in the repair unit, and based on the estimated probability, estimate a yield after repair at the completion of the transistor forming process. The yield after repair is also calculable by calculating the number of chips to be repaired by replacing faults with redundant circuits. A yield drop by faults caused during the wiring processes of steps S63 to S74 (FIGS. 16 and 17) is also considered, and a final yield obtainable after the completion of the wafer processing is calculated.

(4) According to the yield after the completion of the wafer processing, each lot is checked to see if the lot must be scrapped. Namely, calculations are made to find profit and loss to be produced when a given lot is continuously processed after the evaluation, and a loss (manufacturing cost) to be produced when the given lot is scrapped at the evaluation. The both values are compared with each other, and based on a result of the comparison, a determination is made to scrap or not.

Figure 24:
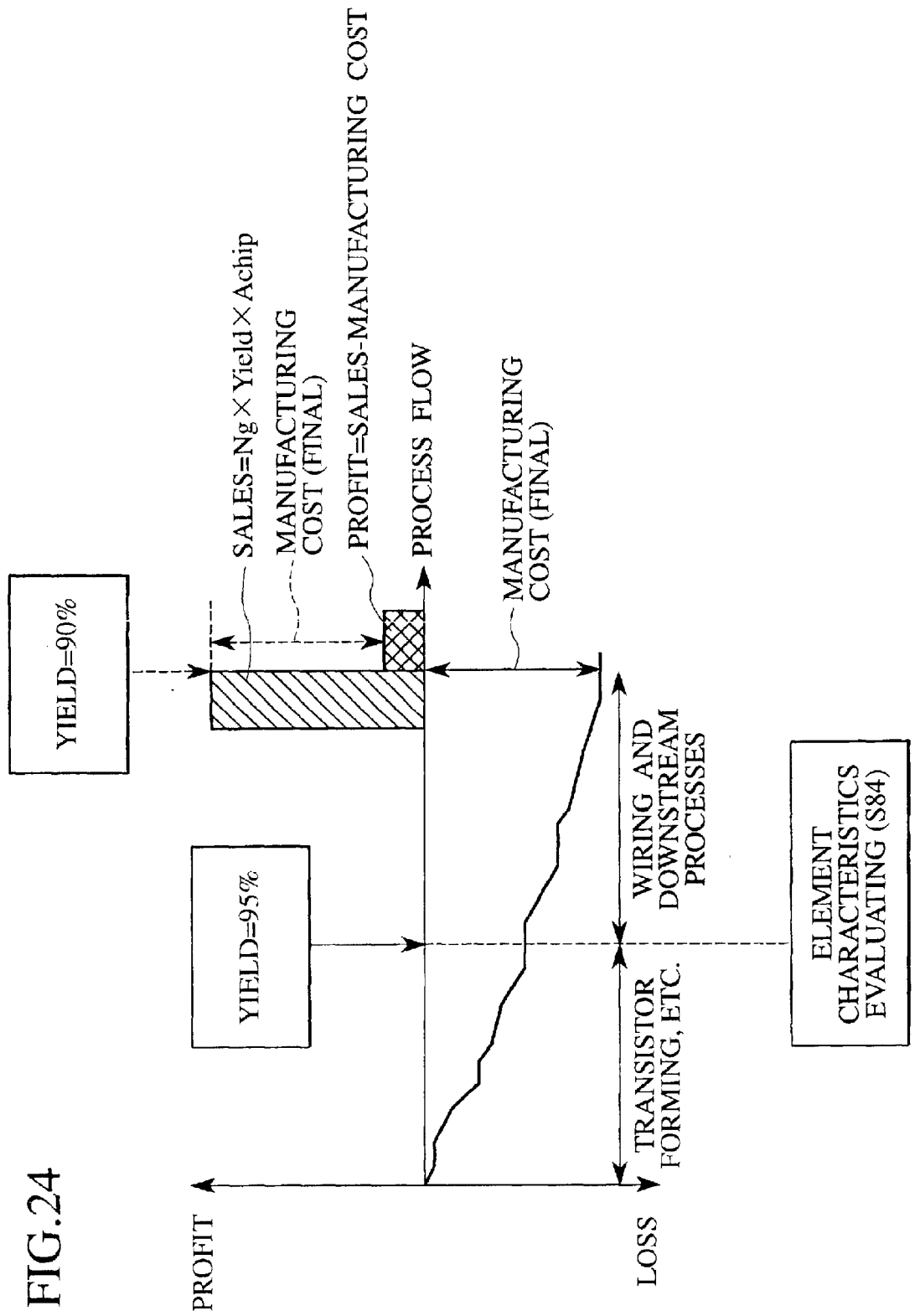
FIG. 24 is a graph showing relationships among the process flow, manufacturing cost, sales, and profit of a high-yield lot.

FIG. 24 is a graph showing a lot providing a high yield, a relationship between a process flow and manufacturing cost, and a relationship between sales and profit. On the graph, an abscissa represents a flow of manufacturing processes and an ordinate represents profit and loss. A plotted line indicates a relationship between manufacturing cost and processes. In FIG. 24, the manufacturing cost of the lot cumulatively increases according to the flow of processes. The element characteristics evaluating process of step S84 of FIG. 23 indicates that a yield after repair at the completion of the transistor forming process of step S65 is 95% in FIG.

24. If the wiring processes and downstream processes are carried out after the evaluating process of step S84, a final yield is 90% in FIG. 24. In this case, the sales exceed the manufacturing cost at the final stage, to provide profit as the difference between the sales and the manufacturing cost.

Figure 25A:
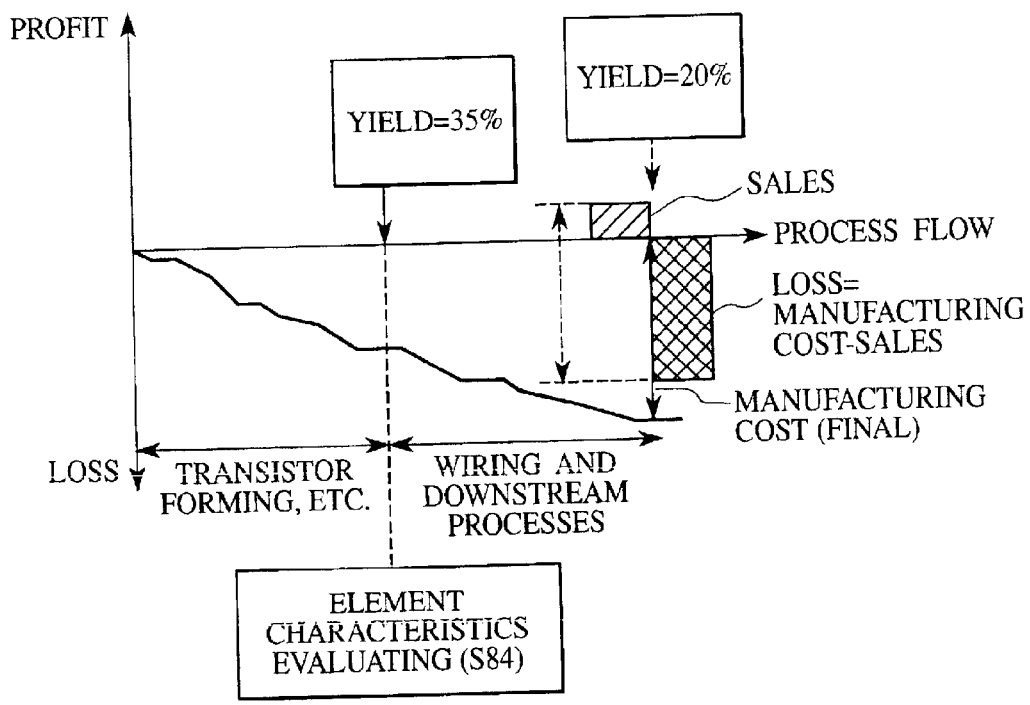
FIG. 25A is a graph showing relationships among the process flow, manufacturing cost, sales, and loss of a low-yield lot.

FIG. 25A is a graph showing a lot whose yield is insufficient, a relationship between a flow of processes and manufacturing cost, and a relationship between final sales and loss. In FIG. 25A, the element evaluating process of step S84 shows a yield after repair of 35%. If the lot is continuously processed through the wiring processes and downstream processes, a final yield will be 20%. In this case, the sales are below the manufacturing cost at the final stage, to cause a loss. If a lot whose yield is very low is processed to the final stage, a final loss will be significant.

Figure 25B:
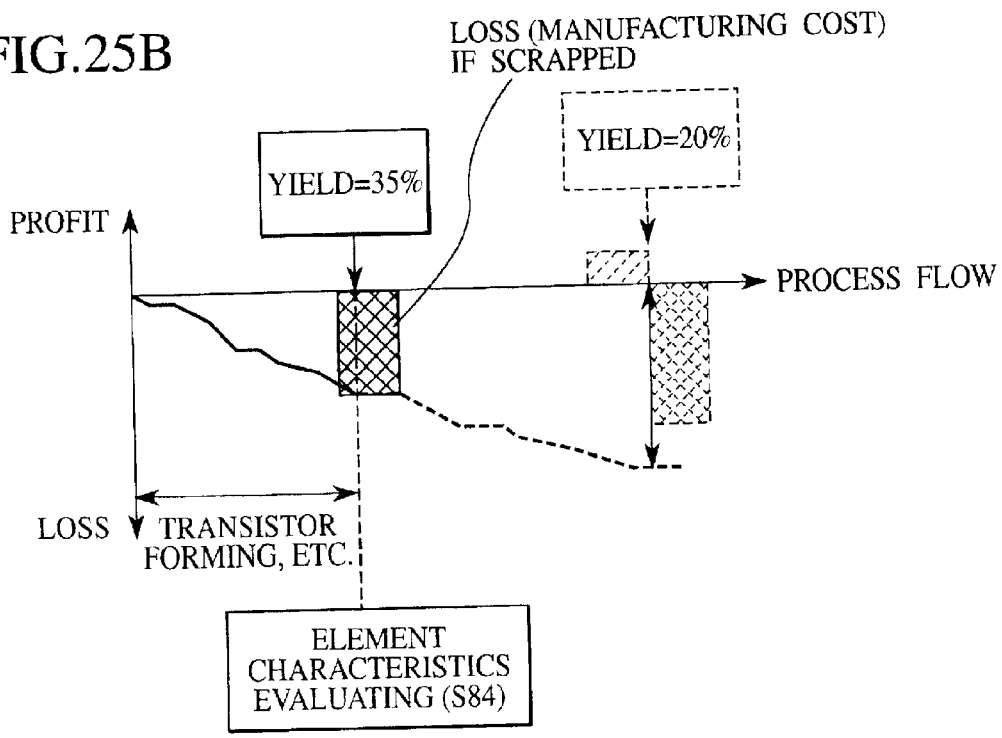
FIG. 25B is a graph showing a loss (manufacturing cost) caused by scrapping the low-yield lot of FIG. 25A after an element characteristics evaluating step (S84).

After considering a yield after repair provided by the evaluating process of step S84 and a final yield estimated at this point, the problematic lot may be scrapped quickly without carrying out the wiring processes and downstream processes on the lot. This minimizes a loss equivalent to the manufacturing cost spent to the evaluating process of step S84. FIG. 25B is a graph showing the poor-yield lot of FIG. 25A and a loss (manufacturing cost) to occur when the lot is scrapped at the evaluating process of step S84. As shown in FIG. 25B, scrapping the lot of a low yield of 35% at the evaluating process of step S84 causes a loss corresponding to the manufacturing cost to the transistor forming process of step S61. Comparing this with the loss to occur when the lot is processed to the final stage, it is understood that the loss caused by scrapping the lot is smaller. In practice, scrapping low-yield lots produces a space in the wiring processes to shorten the production period of other lots or increase the number of lots to process, thereby improving the processing efficiency of manufacturing lines.

Although the eighth embodiment has been explained in connection with scrapping lots, this does not limit the eighth embodiment. According to the eighth embodiment, a wafer or a group of wafers involving clustering faults may be scrapped.

When determining whether or not a lot must be scrapped, it is necessary to consider customer's requirements. For example, some customer may request to receive products as early as possible even if the yield of products is low. In this case, lots of low yield must continuously be processed to the final stage without scrapping the lots. If a customer requests to receive many products at low prices even if the delivery of the products is delayed, lots of low yield must be scrapped as shown in FIGS. 25A and 25B.

As explained above, the eighth embodiment forms transistors, carries out a testing process before wiring processes, to evaluate the characteristics of the transistors, searches for clustering faults according to a result of the evaluation, estimates a yield at this point, estimates a yield in processes that follow, and estimates a final yield. According to the final yield, the eighth embodiment correctly determines whether or not the tested lot or wafers must be scrapped. The eighth embodiment avoids a loss caused by search targets (lots, wafers, etc.,) of low yield.

Although the eighth embodiment forms transistors, carries out a testing process before wiring processes, searches for clustering faults according to a result of the testing process, and determines whether or not the tested target must be scrapped, these procedures do not limit the eighth embodiment. Any one of the testing/inspecting processes explained in the sixth embodiment of FIGS. 16 to 18 including the testing process carried out after partly forming wiring may search for clustering faults, and according to the searched clustering faults, determine whether or not the target must be scrapped. The testing/inspecting processes usable by the eighth embodiment include, for example, the faults finding process of step S54, the faults finding process on trench capacitors of step S56, the faults finding process on channels of step S60, the faults finding process on M1 of step S66, and the faults finding process on M2 of step S69.

Additional advantages and modifications of the present invention will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of searching for clustering imperfect entities, comprising:
   entering data on imperfect entities present in a search target;
   calculating a frequency distribution of the imperfect entities in unit cells divided from the search target;
   approximating the frequency distribution by overlaying at least two discrete distribution functions; and
   searching for clustering imperfect entities according to weights of the discrete distribution functions on the frequency distribution.

2. The method of claim 1, wherein:
   entering data on imperfect entities comprises entering the number of imperfect entities in each of the unit cells and entering criterial conditions for the weights of the discrete distribution functions; and
   searching for clustering imperfect entities comprises searching for clustering imperfect entities according to the criterial conditions.

3. The method of claim 2, wherein:
   the discrete distribution functions include a Poisson distribution and a negative binomial distribution;
   entering criterial conditions comprises entering a threshold weight to test the weight of the negative binomial distribution on the frequency distribution; and
   searching for clustering imperfect entities comprises determining the presence of clustering imperfect entities if the weight of the negative binomial distribution is greater than the threshold weight and no presence of clustering imperfect entities if the weight of the negative binomial distribution is equal to or smaller than the threshold weight.

4. The method of claim 2, wherein entering data on imperfect entities includes:
   detecting imperfect entities present in the search target;
   storing coordinates of the detected imperfect entities; and
   converting the coordinates of the detected imperfect entities into the numbers of imperfect entities in the unit cells divided from the search target.

5. The method of claim 1, wherein:
   entering data on imperfect entities comprises entering the numbers of imperfect entities present in the unit cells divided from the search target and coordinates of the unit cells on the search target; and
   searching for clustering imperfect entities comprises calculating, as a clustering faults threshold, the number of imperfect entities that equalizes components of the discrete distribution functions with each other and searching for every unit cell involving imperfect entities whose number is greater than the clustering faults threshold.

6. The method of claim 5, wherein:

the discrete distribution functions include a Poisson distribution and a negative binomial distribution; and calculating a clustering faults threshold comprises calculating the number of imperfect entities that equalizes components of the Poisson distribution with components of the negative binomial distribution.

7. The method of claim 5, wherein entering data on imperfect entities includes:

detecting imperfect entities present in the search target;

storing coordinates of the detected imperfect entities; and converting the coordinates of the detected imperfect entities into the numbers of imperfect entities in the unit cells divided from the search target and coordinates of the unit cells.

8. The method of claim 1, wherein the imperfect entities include electrical faults.

9. The method of claim 1, wherein the imperfect entities include defects.

10. An apparatus for searching for clustering imperfect entities, comprising:

an input unit entering data on imperfect entities present in a search target;

a frequency distribution calculator calculating, according to the entered data, a frequency distribution of the imperfect entities in unit cells divided from the search target;

a discrete distribution function calculator approximating the frequency distribution by overlaying at least two discrete distribution functions; and a clustering faults searcher searching for clustering imperfect entities according to weights of the discrete distribution functions on the frequency distribution.

11. The apparatus of claim 10, wherein:

the data on imperfect entities include the number of imperfect entities in each of the unit cells and criterial conditions for the weights of the discrete distribution functions; and the clustering faults searcher searches for clustering imperfect entities according to the criterial conditions.

12. The apparatus of claim 10, wherein:

the data on imperfect entities include the numbers of imperfect entities present in the unit cells divided from the search target and coordinates of the unit cells on the search target; and the clustering faults searcher comprises a clustering faults threshold calculator to calculate, as a clustering faults threshold, the number of imperfect entities that equalizes components of the discrete distribution functions with each other, and a location searcher to search for every unit cell involving imperfect entities whose number is greater than the clustering faults threshold.

13. A program executable by computer, comprising:

entering data on imperfect entities present in a search target;

calculating a frequency distribution of the imperfect entities in unit cells divided from the search target;

approximating the frequency distribution by overlaying at least two discrete distribution functions; and searching for clustering imperfect entities according to weights of the discrete distribution functions on the frequency distribution.

14. A method of searching for clustering imperfect entities, comprising:

entering data on imperfect entities present in a search target;

calculating a frequency distribution of the imperfect entities in unit cells divided from the search target;

dividing the frequency distribution into at least two discrete distribution functions; and searching for clustering imperfect entities according to weights of the discrete distribution functions on the frequency distribution.

15. The method of claim 14, wherein the at least two discrete distribution functions approximate the imperfect entities randomly occurring in the search target and the clustering imperfect entities caused by a specific reason in the search target, respectively.

* * * * *